(12) United States Patent
Chen

(10) Patent No.: US 12,317,625 B2
(45) Date of Patent: May 27, 2025

(54) IMAGE SENSOR PIXEL WITH DEEP TRENCH ISOLATION STRUCTURE

(71) Applicant: MAGVISION SEMICONDUCTOR (BEIJING) INC., Beijing (CN)

(72) Inventor: Gang Chen, San Jose, CA (US)

(73) Assignee: MAGVISION SEMICONDUCTOR (BEIJING) INC., Beijing (CN)

( * ) Notice: Subject to any disclaimer, the term of this patent is extended or adjusted under 35 U.S.C. 154(b) by 681 days.

(21) Appl. No.: 17/506,947

(22) Filed: Oct. 21, 2021

(65) Prior Publication Data

US 2023/0131599 A1 Apr. 27, 2023

(51) Int. Cl.
H01L 27/14 (2006.01)
H10F 39/00 (2025.01)

(52) U.S. Cl.
CPC ......... *H10F 39/807* (2025.01); *H10F 39/024* (2025.01)

(58) Field of Classification Search
CPC ................ H01L 27/14685; H01L 27/14698
See application file for complete search history.

(56) References Cited

U.S. PATENT DOCUMENTS

| | | | | |
|---|---|---|---|---|
| 9,041,071 B2* | 5/2015 | Ahn | ............... | H01L 31/09 257/292 |
| 9,160,949 B2* | 10/2015 | Zhang | ............... | H01L 27/14643 |
| 9,899,441 B1* | 2/2018 | Cheng | ............... | H01L 27/14627 |
| 9,923,009 B1* | 3/2018 | Hsiung | ............... | H01L 27/14685 |
| 10,163,647 B2* | 12/2018 | Tsai | ............... | H01L 27/14687 |
| 2005/0082582 A1* | 4/2005 | Rhodes | ............... | H01L 27/14643 438/588 |
| 2014/0291481 A1* | 10/2014 | Zhang | ............... | H01L 31/107 257/431 |
| 2016/0204142 A1* | 7/2016 | Um | ............... | H01L 27/1464 257/446 |
| 2018/0166293 A1* | 6/2018 | Tsai | ............... | H01L 21/3081 |
| 2019/0139997 A1* | 5/2019 | Chiang | ............... | H01L 27/14689 |
| 2021/0313477 A1* | 10/2021 | Kusukawa | ............... | H01L 27/14698 |

(Continued)

FOREIGN PATENT DOCUMENTS

CN 104103655 A 10/2014

*Primary Examiner* — Mounir S Amer
*Assistant Examiner* — Alexander Belousov
(74) *Attorney, Agent, or Firm* — HAYNES AND BOONE, LLP

(57) ABSTRACT

An image sensor device is disclosed. The image sensor device includes a number of pixels and neighboring pixels are isolated by deep trench isolation structures. In an embodiment, a method of forming a deep trench isolation structure includes performing a first etching process to remove a portion of a substrate, thereby forming a first trench in the substrate, performing a first doping process to form a first sidewall doped region along a sidewall surface of the first trench, after the performing of the first plasma doping process, performing a second etching process to extend the first trench, thereby forming a second trench in the substrate, and, after the performing of the second etching process, performing a second doping process to form a second sidewall doped region along a sidewall surface of the second trench, a portion of the second sidewall doped region overlaps with the first sidewall doped region.

20 Claims, 28 Drawing Sheets

(56) References Cited

U.S. PATENT DOCUMENTS

| | | | |
|---|---|---|---|
| 2023/0082312 A1* | 3/2023 | Chen | H01L 27/14623 257/432 |
| 2023/0089511 A1* | 3/2023 | Chen | H01L 27/14689 257/432 |
| 2023/0092590 A1* | 3/2023 | Park | H01L 27/1463 257/432 |
| 2023/0131599 A1* | 4/2023 | Chen | H01L 27/14689 257/432 |

* cited by examiner

IMAGE SENSOR PIXEL WITH DEEP TRENCH ISOLATION STRUCTURE

BACKGROUND

The applications of image sensors have become ubiquitous. An image sensor may include an array of pixels arranged in two dimensions. Each of the pixels includes a photodiode, or other suitable photoelectric elements. A micro-lens (or microlens) may be formed over the photodiode. The micro-lens focuses light onto the photodiode, and the photodiode converts the light into electric signals. The electric signals are output from the image sensor to other components of a host electronic device, such as a digital camera, a mobile phone, a computer, a security camera, an automotive product, a medical accessory, or other electronic device, to form an image.

The semiconductor integrated circuit (IC) industry has experienced exponential growth. Technological advances in IC materials and design have produced generations of ICs where each generation has smaller and more complex circuits than the previous generation. The technologies used to manufacture image sensors, such as complementary metal oxide semiconductor (CMOS) image sensor technology, have continued to advance as well. The demands for higher resolution and lower power consumption have driven the trend of further miniaturization and integration of image sensors. The corresponding pixels in image sensors are therefore scaled down. This scaling down process generally provides benefits by increasing production efficiency and lowering associated costs. Such scaling down has also increased the complexity of processing and manufacturing. For example, as the sizes of pixels continue to decrease, optical cross talk and interference among pixels may occur more often. Deep trench isolation (DTI) structures have been proposed to isolate pixels one from another. Although existing DTI structures have been generally adequate for their intended purposes, they are not satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
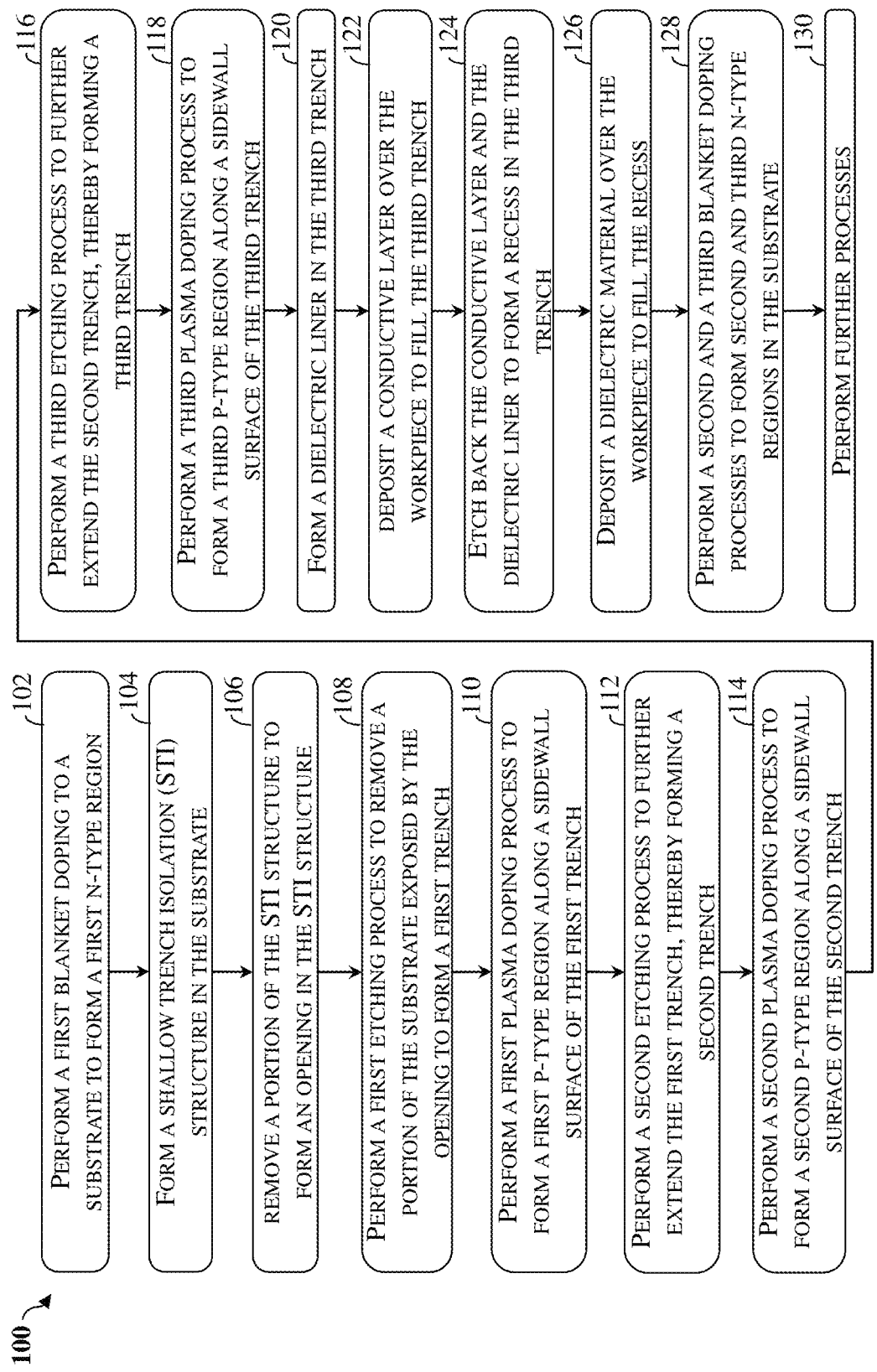
FIG. 1 illustrates a flowchart of an exemplary method for fabricating a semiconductor device having a deep trench isolation (DTI) structure, according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

An image sensor may include an array of pixels arranged in two dimensions. Each of the pixels includes a photodiode and a number of transistors (e.g., transfer gate transistor) formed in a pixel region. Generally, the photodiode includes an n-type region having a gradient doping profile to increase the charge transfer from the photodiode to a floating diffusion region of the pixel. According to the gradient doping profile, a dopant concentration of an upper portion of the n-type region that is closer to a gate structure of the transfer gate transistor is higher than a dopant concentration of a lower portion of the n-type region of the photodiode that is further away from that gate structure.

Deep trench isolation (DTI) structures, such as BDTI (back-side DTI) structures and FDTI (front-side DTI or referred to as full-depth DTI) structures, have been picked as a promising approach for isolating neighboring pixels of CMOS image sensors. During the manufacturing of the image sensors, surface defects (e.g., dangling bonds) may be formed in a region of a semiconductor substrate adjacent to the sidewall of the DTI structure. Such surface defects may thermally generate electric charges even without any incident light. If left untreated, the surface defects may produce dark currents, leading to white pixels. To reduce the surface defects, the sidewall surface of the DTI structure may be doped with dopants having a doping polarity opposite to a dopant polarity of dopants in the photodiode to provide a carrier accumulation and increase the passivation. For example, in situations where the photodiode includes an n-type region, the sidewall surface of the DTI structure may be doped with p-type dopants. However, the gradient doping profile of the n-type region in the photodiode increases the difficulty of the sidewall passivation. If the sidewall surface of the DTI structure is doped with p-type dopants uniformly throughout its depth direction (i.e., Z direction), either the upper portion of the DTI structure would not provide hole accumulations or the lower portion of the DTI structure would have extra p-type dopants that compensate n-type dopants in the lower portion of the photodiode, degrading the photodiode's performance. To provide enough passivation along the entire sidewall of the DTI structure while not compromising other aspects of the design performances, it is desirable to provide a p-type region (along the sidewall surface of the DTI structure) having a gradient doping profile that is similar to the gradient doping profile of the n-type region in the photodiode. However, existing photolithography processes used in the formation of photodiodes and DTI structures may not have sufficient resolution.

The present disclosure is generally related to image sensors. More particularly, some embodiments are related to CMOS image sensors with a DTI structure defining an array of pixel regions for components of pixels to reside therein. In an embodiment, the DTI structure is a hybrid structure extending through a substrate and includes an upper portion and a lower portion. The sidewall surface of the lower portion of the DTI structure includes a p-type region with a gradient doping profile. The p-type region is formed without using a photolithography process, for example, to form an ion implantation mask.

The various aspects of the present disclosure will now be described in more detail with reference to the figures. In that regard, FIG. 1 is a flowchart illustrating method 100 of forming a semiconductor device with a front-side deep trench isolation (FDTI) structure according to embodiments of the present disclosure. Method 100 is described below in conjunction with FIGS. 2-28, where FIGS. 2-23 and 25-28 are fragmentary cross-sectional views of a workpiece 200 at different fabrication stages according to embodiments of method 100 and FIG. 24 shows doping profiles of regions in the workpiece 200. Method 100 is merely an example and is not intended to limit the present disclosure to what is explicitly illustrated therein. Additional steps may be provided before, during and after the method 100, and some steps described can be replaced, eliminated, or moved around for additional embodiments of the method. Not all steps are described herein in detail for reasons of simplicity. Because the workpiece 200 will be fabricated into a semiconductor device 200 or an image sensor 200 upon conclusion of the fabrication processes, the workpiece 200 may be referred to as the semiconductor device 200 or image sensor 200 depending on the context. The method 100 may be used to form deep trench isolation structures in stacked silicon CMOS image sensors, non-stack image sensors, and other suitable structures. For avoidance of doubts, the X, Y and Z directions in the figures are perpendicular to one another and are used consistently. Throughout the present disclosure, like reference numerals denote like features unless otherwise excepted.

Figure 2:
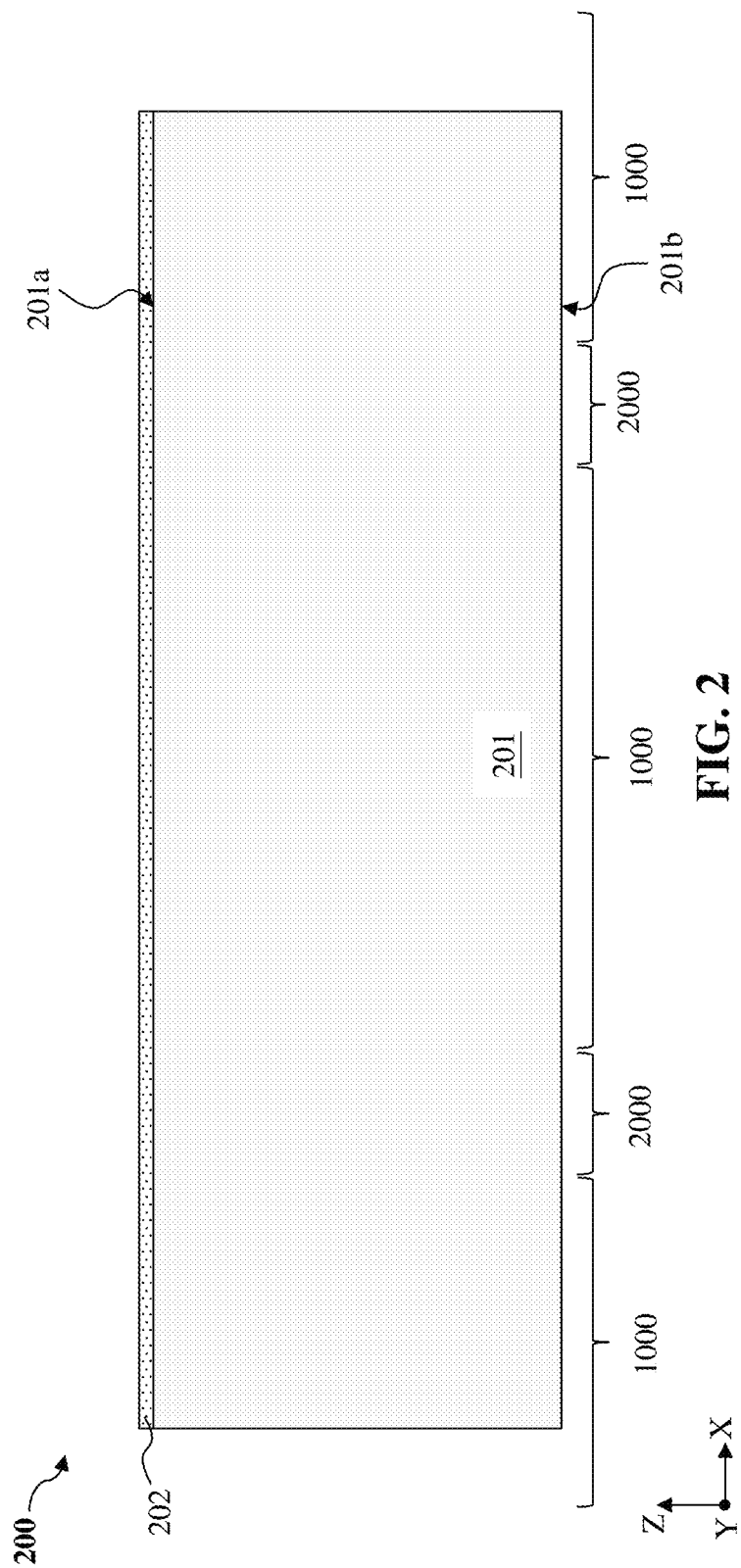
FIGS. 2, 3, 4, 5, 6, 7, 8, 9, 10, 11, 12, 13, 14, 15, 16, 17, 18, 19, 20, 21, 22, 23, 25, 26, 27, and 28 illustrate fragmentary cross-sectional views of a workpiece during various fabrication stages in the method of FIG. 1, according to various aspects of the disclosure.
Figure 3:
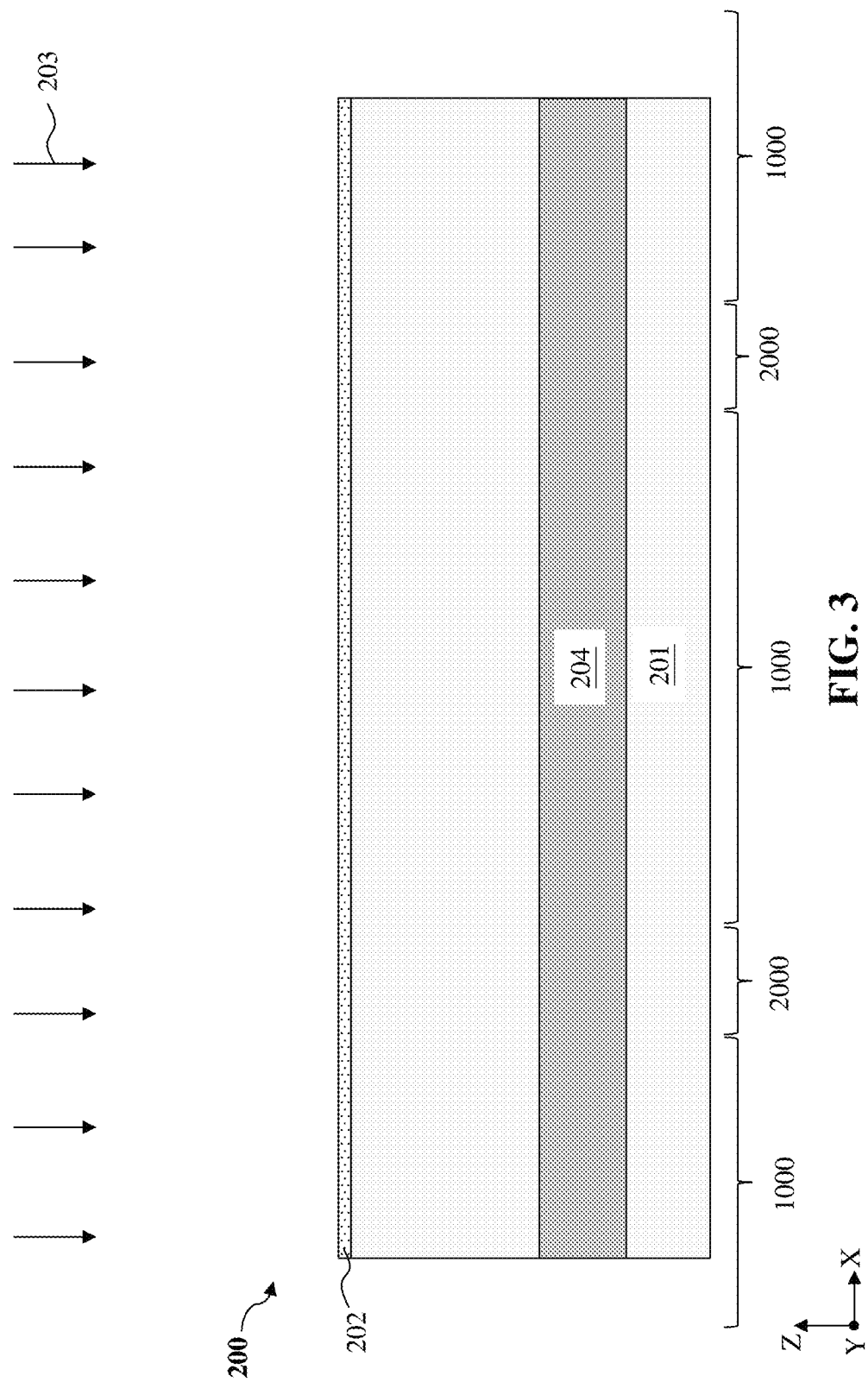

Referring to FIGS. 1-3, method 100 includes a block 102 where a first blanket doping process 203 is performed to form a doped region 204 in a substrate 201. In an embodiment, the substrate 201 is a bulk silicon substrate (i.e., including bulk single-crystalline silicon). The substrate 201 may include other semiconductor materials in various embodiments, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 201 may include a semiconductor-on-insulator substrate, such as a silicon-on-insulator (SOI) substrate, a silicon germanium-on-insulator (SGOI) substrate, or a germanium-on-insulator (GOI) substrate, and includes a carrier, an insulator on the carrier, and a semiconductor layer on the insulator. The substrate 201 includes a first surface 201a and a second surface 201b facing each other (see FIG. 2). In embodiments represented in FIG. 2, the first surface 201a is the top surface or the front-side surface of the substrate 201, and the second surface 201b is the bottom surface or the back-side surface of the substrate 201. The substrate 201 includes dopants of a first type. In an example, the substrate 201 is a p-type substrate.

As shown in FIG. 2, the workpiece 200 also includes a pad oxide layer 202 formed over the substrate 201. The pad oxide layer 202 may be a thin film including silicon oxide and may be formed using a thermal oxidation process or other suitable processes. The workpiece 200 includes a number of pixel regions 1000 for forming pixels and a numbers of isolation regions 2000 for forming isolation structures. Upon conclusion of the fabrication process in method 100, isolation structures (e.g., DTI structure 262 shown in FIG. 27) formed in the isolation regions 2000 isolate two adjacent pixel regions 1000. The isolation regions 2000 may be disposed at the edges of each of the pixel regions 1000, such that each of the pixel regions 1000 may be defined as a closed space surrounded by walls of the to-be-formed isolation structures (e.g., DTI structure 262 shown in FIG. 27) from a top view.

Reference is now made to FIG. 3, after forming the pad oxide layer 202, the first blanket doping process 203 is performed to dope a lower region of the substrate 201 with dopants of a second type to form the doped region 204. In an embodiment, the doped region 204 is a charge-collection portion of a photodiode and thus has a doping polarity opposite to the doping polarity of the substrate 201. In the present embodiment, the first blanket doping process 203 may be performed by implanting appropriate n-type dopants (e.g., phosphorus (P) or Arsenic (As)) at a first implant dosage. The doped region 204 may also be referred to as a first blanket doped region 204 or a doped lower region 204. Here, the blanket doping process refers to a process used to form a doped region in a substrate without using a mask or implantation mask. In an embodiment, the first blanket doping process 203 includes a blanket ion implantation process.

Figure 4:
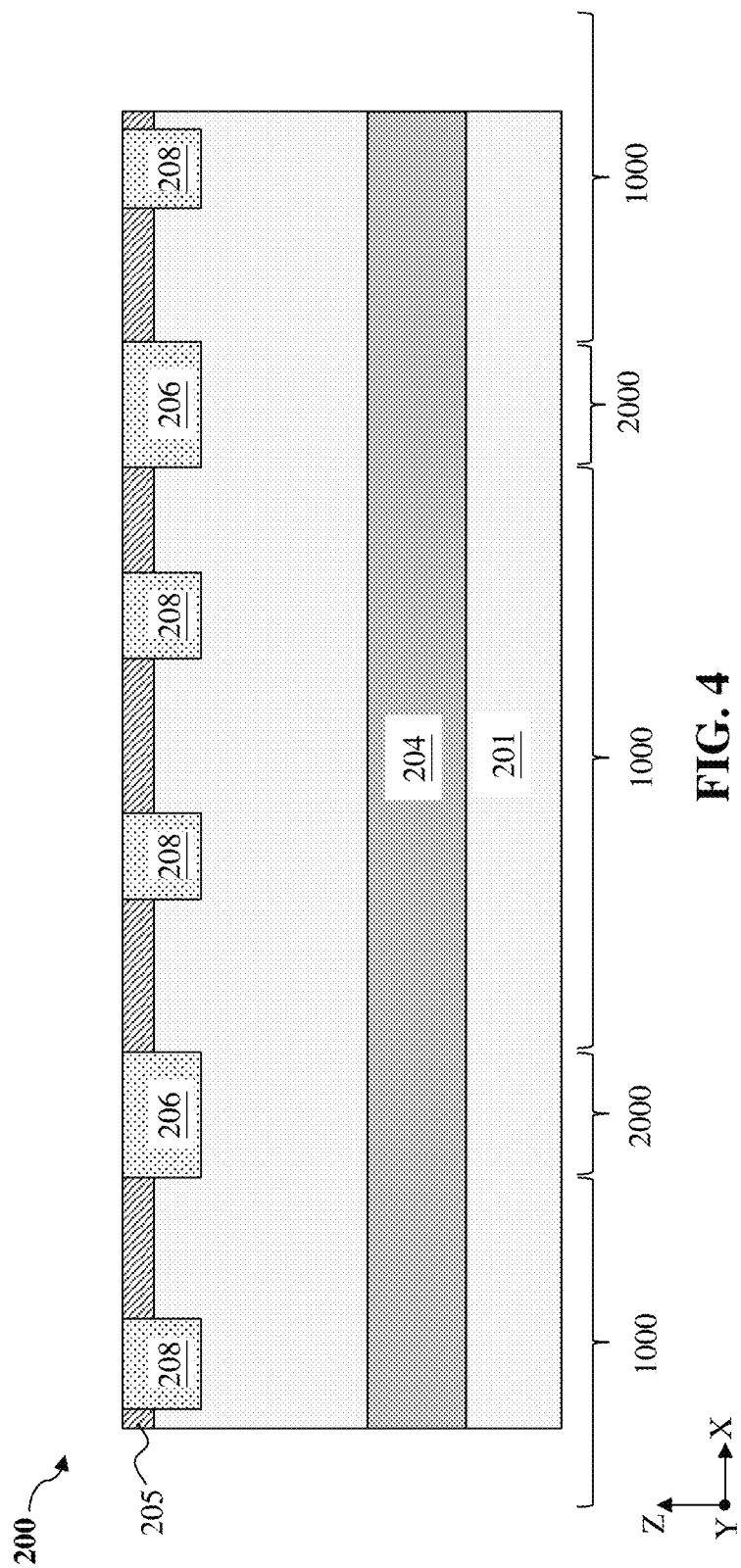

Referring to FIGS. 1 and 4, method 100 includes a block 104 where a first isolation structure 206 is formed in the front side of the substrate 201 and in the isolation region 2000. In some embodiments, the workpiece 200 also includes one or more second isolation structures 208 formed in each of the pixel regions 1000 to isolate two adjacent components (e.g., isolate two adjacent transistors) in the same pixel region 1000. It is noted that, in embodiments where a pixel includes a continuous active region, the workpiece 200 may not include the second isolation structure 208 in that pixel region 1000. The first isolation structure 206 and the second isolation structure 208 may also be referred to as a first shallow trench isolation (STI) structure 206 and a second STI structure 208, respectively. In some embodiments, the first STI structure 206 and the second STI structure 208 may include silicon oxide, silicon oxynitride, fluorine-doped silicate glass (FSG), a low-k dielectric, combinations thereof, and/or other suitable materials. The first STI structure 206 and the second STI structure 208 may be formed simultaneously or sequentially in any order.

In an embodiment, the formation of the first STI structures 206 and the second STI structures 208 includes forming a protective layer 205 on the first surface 201a of the substrate 201, performing a patterning process to the protective layer 205 to form a number of openings exposing portions of the substrate 201, removing the portions of the substrate 201 exposed by the openings to form a number of trenches, forming one or more dielectric layers over the substrate 201 to fill the trenches, and performing a planarization process (e.g., a chemical mechanical polishing (CMP)) to remove excess materials on the protective layer 205 to form the first STI structures 206 and the second STI structures 208. In some embodiments, the planarization process may stop when it reaches the top surface of the protective layer 205, which is used to protect the substrate 201 during the planarization process. That is, a top surface of the protective layer 205 is coplanar with a top surface of the first STI structure 206 and a top surface of the second STI structure 208. The patterning process applied to the protective layer 205 may include multiple processes. For example, a photoresist layer (not shown) may be formed over the protective layer 205, exposed to a radiation source using a photo mask, and subsequently developed to form a patterned photoresist layer. The protective layer 205 may then be etched using the patterned photoresist layer as an etch mask to form the number of openings. The protective layer 205 may include silicon nitride, silicon carbonitride, silicon oxycarbide, silicon oxynitride, silicon oxycarbonitride, other suitable materials, or combinations thereof, and may be formed by chemical vapor deposition (CVD), physical vapor deposition (PVD), other suitable methods, or combinations thereof.

Figure 5:
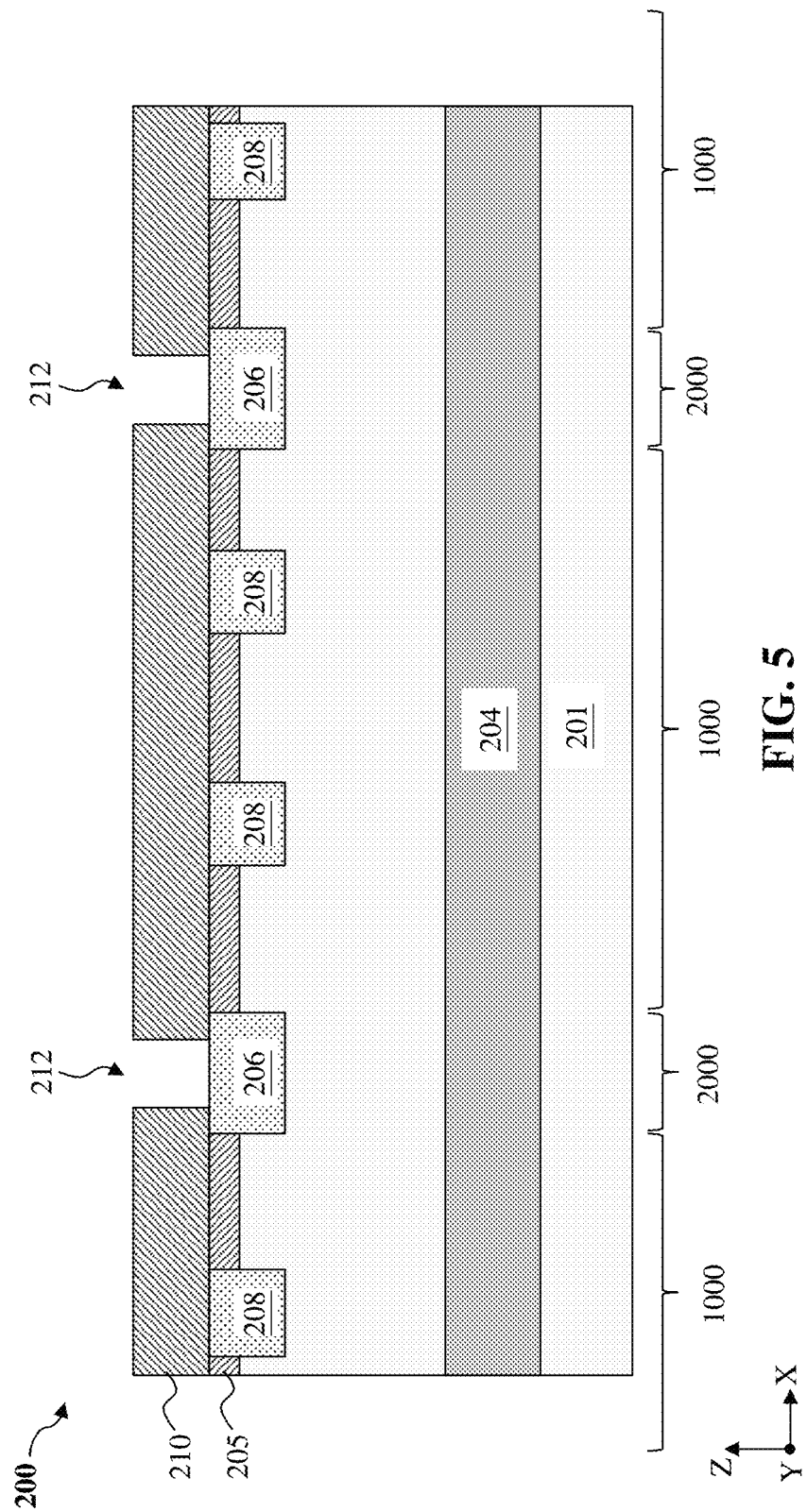
Figure 6:
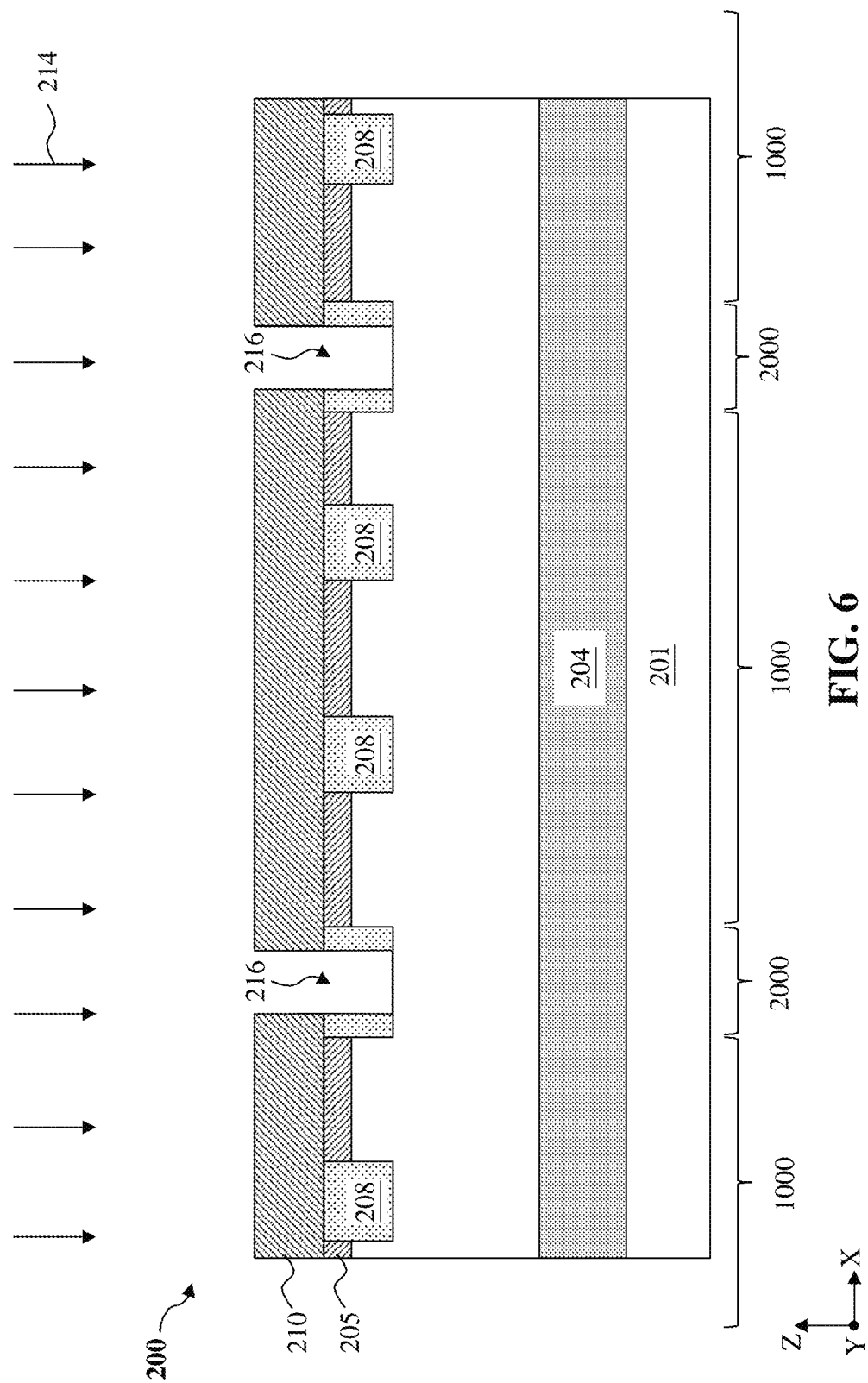

Referring to FIGS. 1 and 5-6, method 100 includes a block 106 where portions of the first STI structure 206 are removed to form openings 216 in the workpiece 200. As shown in FIG. 5, the formation of the openings 216 includes forming a patterned hard mask layer 210 over the workpiece 200. The patterned hard mask layer 210 includes openings 212 exposing portions of the first STI structure 206. In some embodiments, the patterned hard mask layer 210 may include silicon nitride, silicon carbonitride, silicon oxycarbide, silicon oxynitride, silicon oxycarbonitride, other suitable materials, or combinations thereof, and may be formed by chemical vapor deposition (CVD), physical vapor deposition (PVD), other suitable methods, or combinations thereof. In some other embodiments, instead of using the patterned hard mask layer 210, other suitable mask films may be used to facilitate the formation of the openings 216. As shown in FIG. 6, an etching process 214 is then performed to remove the portions of the first STI structure 206 exposed by the openings 212 to form the opening 216 while using the patterned hard mask layer 210 as an etch mask. A depth of the openings 216 may be substantially equal to a thickness of the first STI structure 206 along the Z direction. That is, the openings 216 expose the substrate 201. The etching process 214 may be a dry etching process, a wet etching process, or a combination thereof that implements a suitable etchant.

Figure 7:
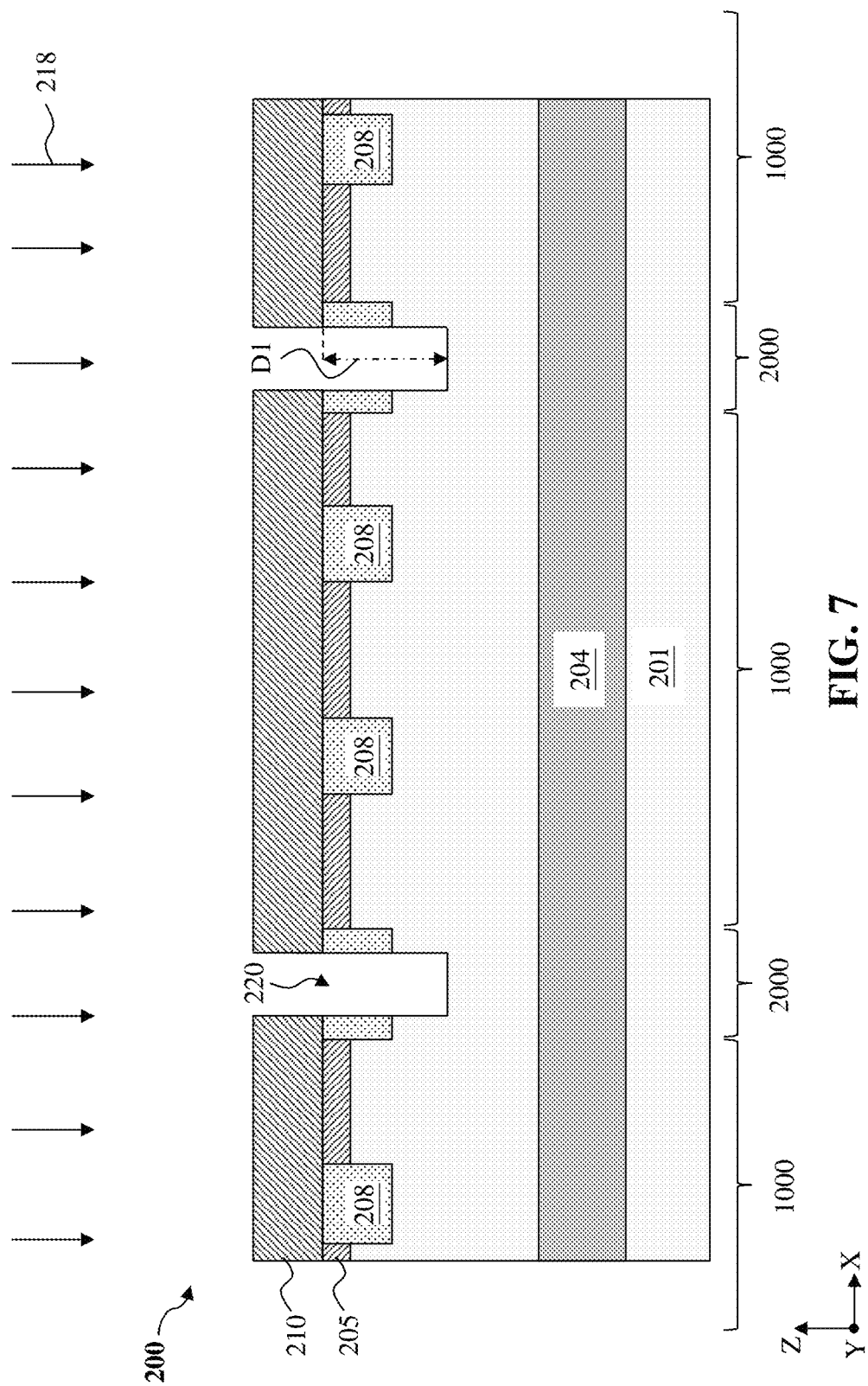

Referring to FIGS. 1 and 7, method 100 includes a block 108 where a first etching process 218 is performed to remove portions of the substrate 201 exposed by the openings 216 to form first trenches 220 in the workpiece 200. The first etching process 218 is performed to extend the openings 216 vertically downward to form the first trenches 220 while using the patterned hard mask layer 210 as an etch mask. The first etching process 218 may be a dry etching process, a wet etching process, or a combination thereof that implements a suitable etchant. In an embodiment, the first etching process 218 may be a dry etching process that implements an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

In embodiments represented in FIG. 7, each of the first trenches 220 extends through the first STI structure 206 and a portion of the substrate 201 but does not reach the top surface of the first blanket doped region 204. The extent at which the substrate 201 is etched is controlled by duration of the first etching process 218. A depth D1 of the first trench 220 may be determined by a doping profile of a photodiode that is to be formed in the adjacent pixel region 1000. The first trenches 220 may include trenches having substantially vertical sidewalls as shown in FIG. 7 or having tapered sidewalls in various embodiments.

Figure 8:
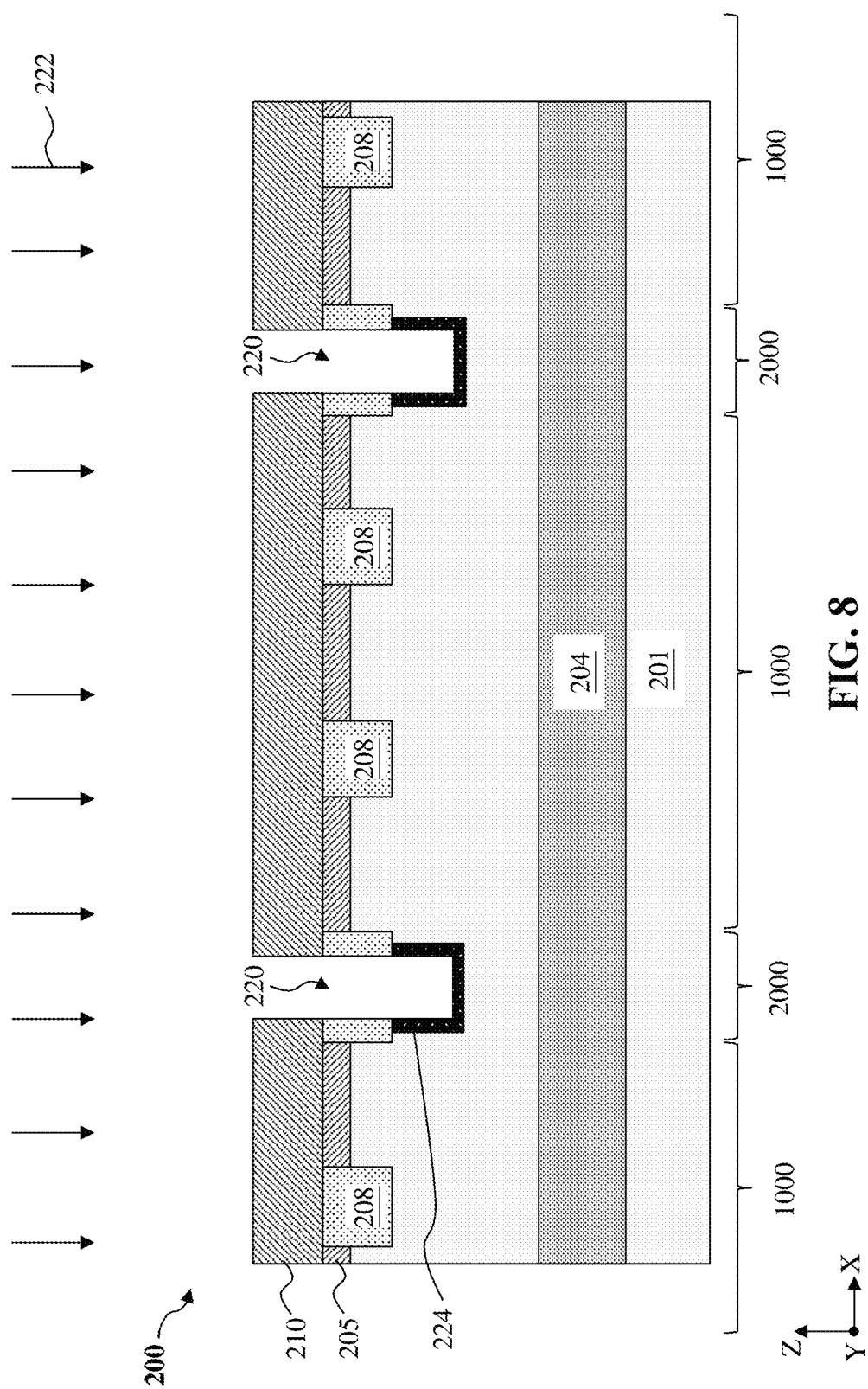
Figure 9:
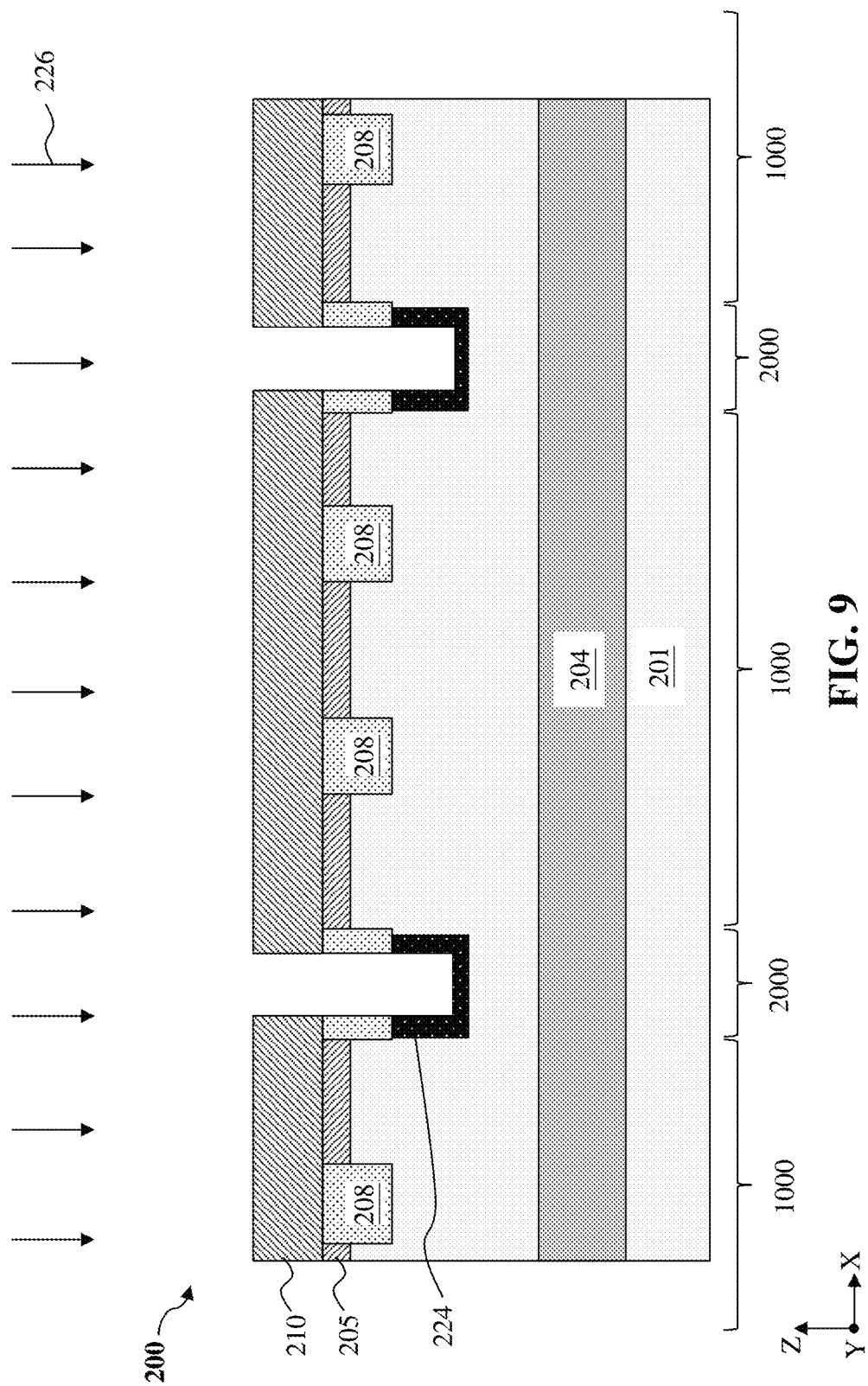

Referring to FIGS. 1 and 8, method 100 includes a block 110 where a first plasma doping process 222 is performed to the workpiece 200 to form a first doped region 224 along the whole sidewall and bottom surfaces of the first trench 220. In some embodiments, the first plasma doping process 222 may include a plasma immersion ion implantation process. The first plasma doping process 222 may be replaced by other suitable doping processes. The first plasma doping process 222 implants portions of the substrate 201 uniformly through the sidewall and bottom surfaces of the first trench 220 with one or more ion species. That is, the first doped region 224 is self-aligned to the first trench 220. A doping polarity of the first doped region 224 is opposite to the doping polarity of the first blanket doped region 204. In embodiments where the first blanket doped region 204 is an n-type region, the first doped region 224 is a p-type region such that holes would accumulate at the sidewall of the first trench 220, thereby isolating the dangling bonds and/or defects at the interface between the substrate 201 and the first trench 220 and reducing dark current and white pixels. In the present embodiment, the first plasma doping process 222 may be performed by implanting appropriate p-type dopants (e.g., boron, $BF_2$). After forming the first doped region 224, as shown in FIG. 9, an annealing process 226 may be performed to drive or diffuse the dopant species from the first doped region 224 into adjacent pixel regions 1000 such that the p-type dopants in the first doped region 224 may compensate n-type dopants near the first trench 220. In some embodiments, the annealing process 226 may be omitted.

Figure 10:
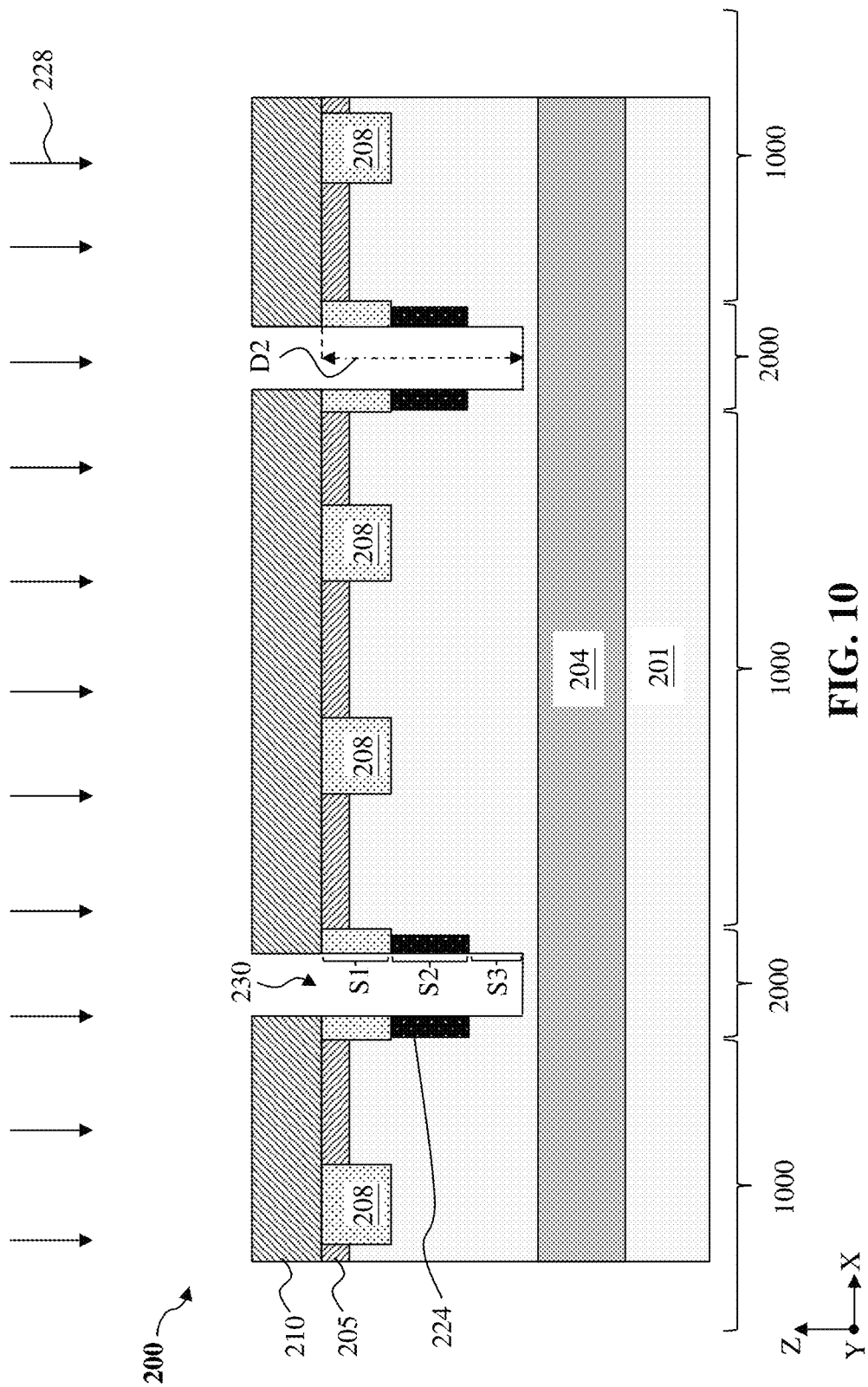

Referring to FIGS. 1 and 10, method 100 includes a block 112 where a second etching process 228 is performed to further extend the first trench 220, thereby forming a second trench 230 in the workpiece 200. The second etching process 228 may be in a way similar to the first etching process 218. In an embodiment, an etchant of the second etching process 228 is the same as the etchant of the first etching process 218. The second etching process 228 is performed to extend the first trench 220 vertically downward to form the second trench 230 while using the patterned hard mask layer 210 as an etch mask. That is, the second etching process 228 removes a portion of the substrate 201 directly under the first trench 220 to form the second trench 230. A portion of the first doped region 224 that is formed along the bottom surface of the first trench 220 is also removed by the second etching process 228. A depth D2 of the second trench 230 may be controlled by duration of the second etching process 228 that is determined by the doping profile of the photodiode to be formed. In embodiments represented in FIG. 10, the second trench 230 extends further into the substrate 201 but does not reach the top surface of the first blanket doped region 204. A sidewall surface of the second trench 230 includes an upper portion S1 exposing the first STI structure 206, a middle portion S2 exposing the first doped region 224, and a lower portion S3 exposing a portion of the p-type substrate 201. The upper portion S1 of the sidewall surface of the second trench 230 may be referred to as the sidewall surface S1, the middle portion S2 of the sidewall surface of the second trench 230 may be referred to as the sidewall surface S2, and the lower portion S3 of the sidewall surface of the second trench 230 may be referred to as the sidewall surface S3.

Figure 11:
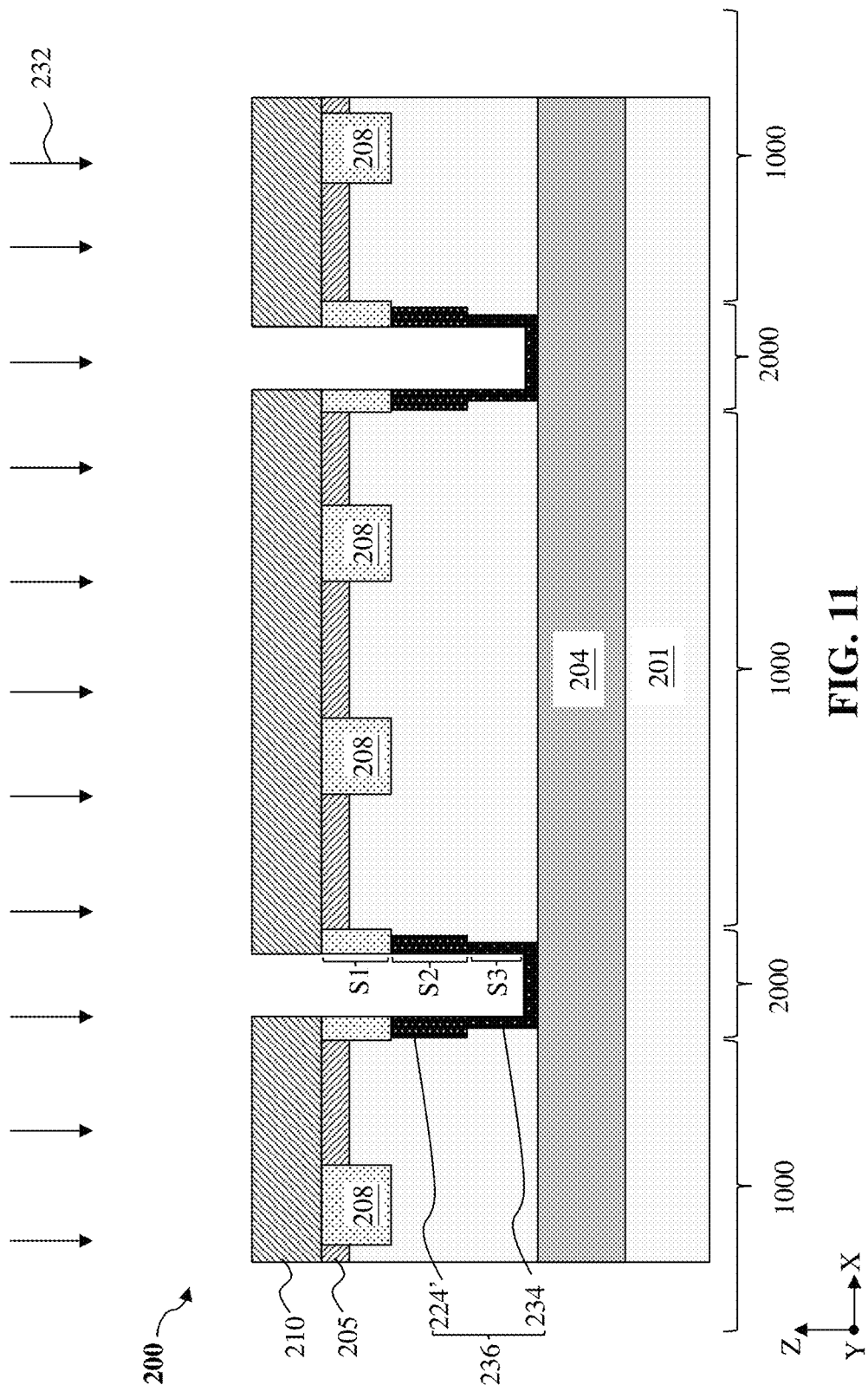

Referring to FIGS. 1 and 11, method 100 includes a block 114 where a second plasma doping process 232 is performed to the workpiece 200. The second plasma doping process 232 implants portions of the substrate 201 uniformly along the sidewall and bottom surfaces of the second trench 230 with one or more ion species. In the present embodiment, the second plasma doping process 232 may be performed by implanting appropriate p-type dopants (e.g., boron, $BF_2$). In an embodiment, an implant dosage of the second plasma doping process 232 is equal to or substantially equal to the implant dosage of the first plasma doping process 222. In some other embodiments, the implant dosage of the second plasma doping process 232 may be different than (i.e., smaller than or greater than) the implant dosage of the first plasma doping process 222. In some embodiment, an implant energy of the second plasma doping process 232 is greater than an implant energy of the first plasma doping process 222.

The second plasma doping process 232 forms a second sidewall doped region along the whole sidewall and bottom surfaces of the second trench 230. Since the first doped region 224 is also exposed in the second trench 230, a portion (i.e., the upper portion) of the second sidewall doped region overlaps with the first doped region 224. That is, the second plasma doping process 232 not only forms a new doped region 234 near the sidewall surface S3, but also implant dopants into the first doped region 224 exposed by the sidewall surface S2. As such, due to the performing of the second plasma doping process 232, the dopant concentration of the first doped region 224 increases. The first doped region 224 after the performing of the second plasma doping process 232 may be referred to as the first doped region 224'. The doped region 234 may be referred to as a second doped region 234. Accordingly, a dopant concentration of the first doped region 224' is greater than a dopant concentration of the second doped region 234. The first doped region 224' and the second doped region 234 may be collectively referred to as a doped region 236. Therefore, a dopant concentration of the doped region 236 is not uniform throughout its depth along the Z direction and has a gradient profile that increases along the Z direction. The doped region 236 is self-aligned to the second trench 230 and a doping polarity of the doped region 236 is opposite to the doping polarity of the first blanket doped region 204. Optionally, an annealing process may be performed after the second plasma doping process 232.

Figure 12:
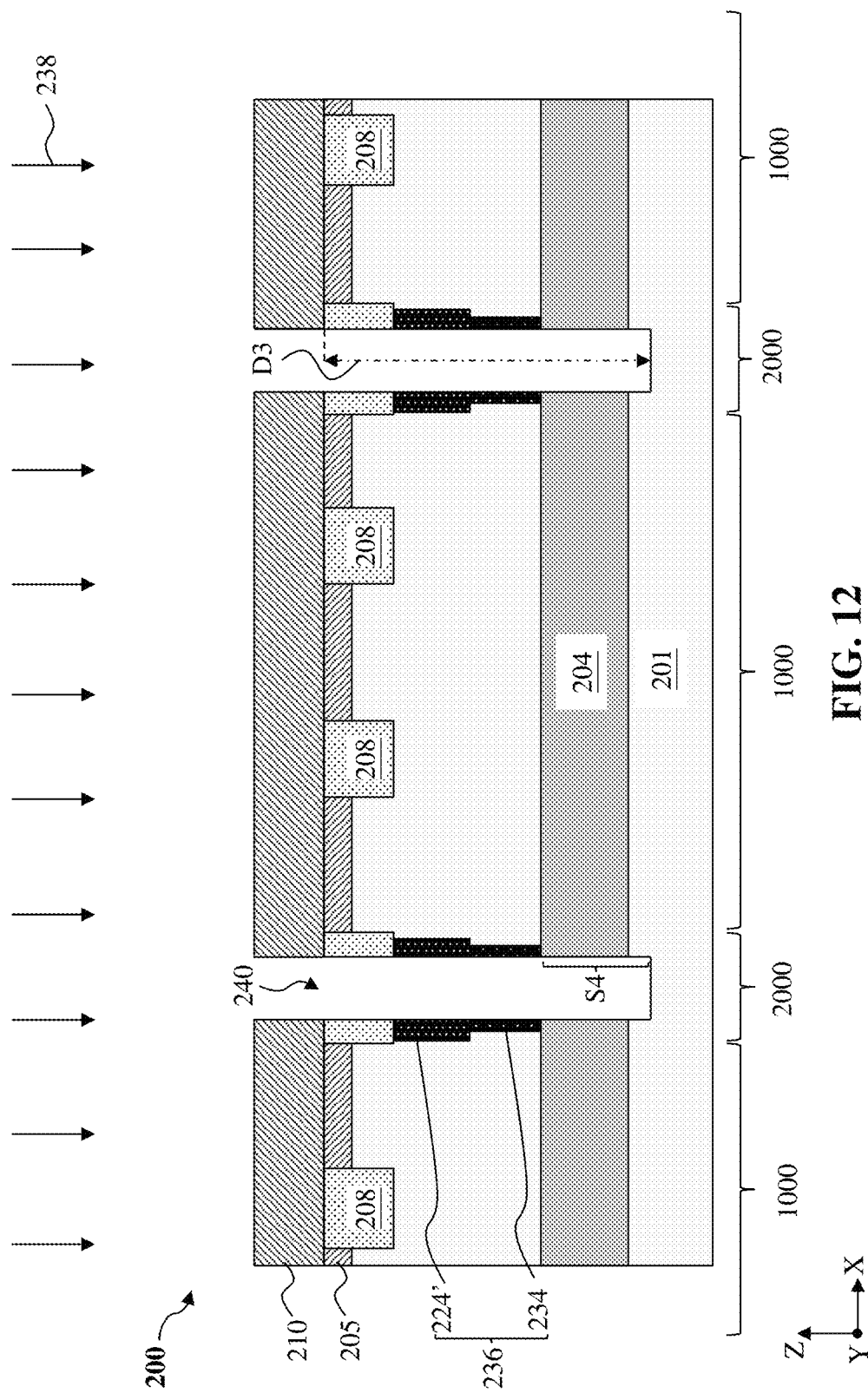

Referring to FIGS. 1 and 12, method 100 includes a block 116 where a third etching process 238 is performed to further extend the second trench 230, thereby forming a third trench 240 in the workpiece 200. The third etching process 238 may be in a way similar to the first etching process 218. In an embodiment, an etchant of the third etching process 238 is the same as the etchant of the first etching process 218. The third etching process 238 is performed to extend the second trench 230 vertically downward to form the third trench 240 while using the patterned hard mask layer 210 as an etch mask. That is, the third etching process 238 removes a portion of the substrate 201 directly under the second trench 230 to form the third trench 240. A portion of the second doped region 234 that is formed along the bottom surface of the second trench 230 is also removed by the third etching process 238. The extent at which the substrate 201 is etched is controlled by duration of the third etching process 238. A depth D3 of the third trench 240 may be determined by the doping profile of the photodiode to be formed in the adjacent pixel region 1000. In embodiments represented in FIG. 12, the third trench 240 extends through the doped region 204 and further into the substrate 201 but does not reach the second surface 201b (i.e., bottom surface) of the substrate 201. A sidewall surface of the third trench 240 includes the sidewall surface (e.g., S1, S2, and S3) of the second trench 230 and a sidewall surface S4 that exposes the first blanket doped region 204 and a portion of the substrate 201 under the first blanket doped region 204.

Figure 13:
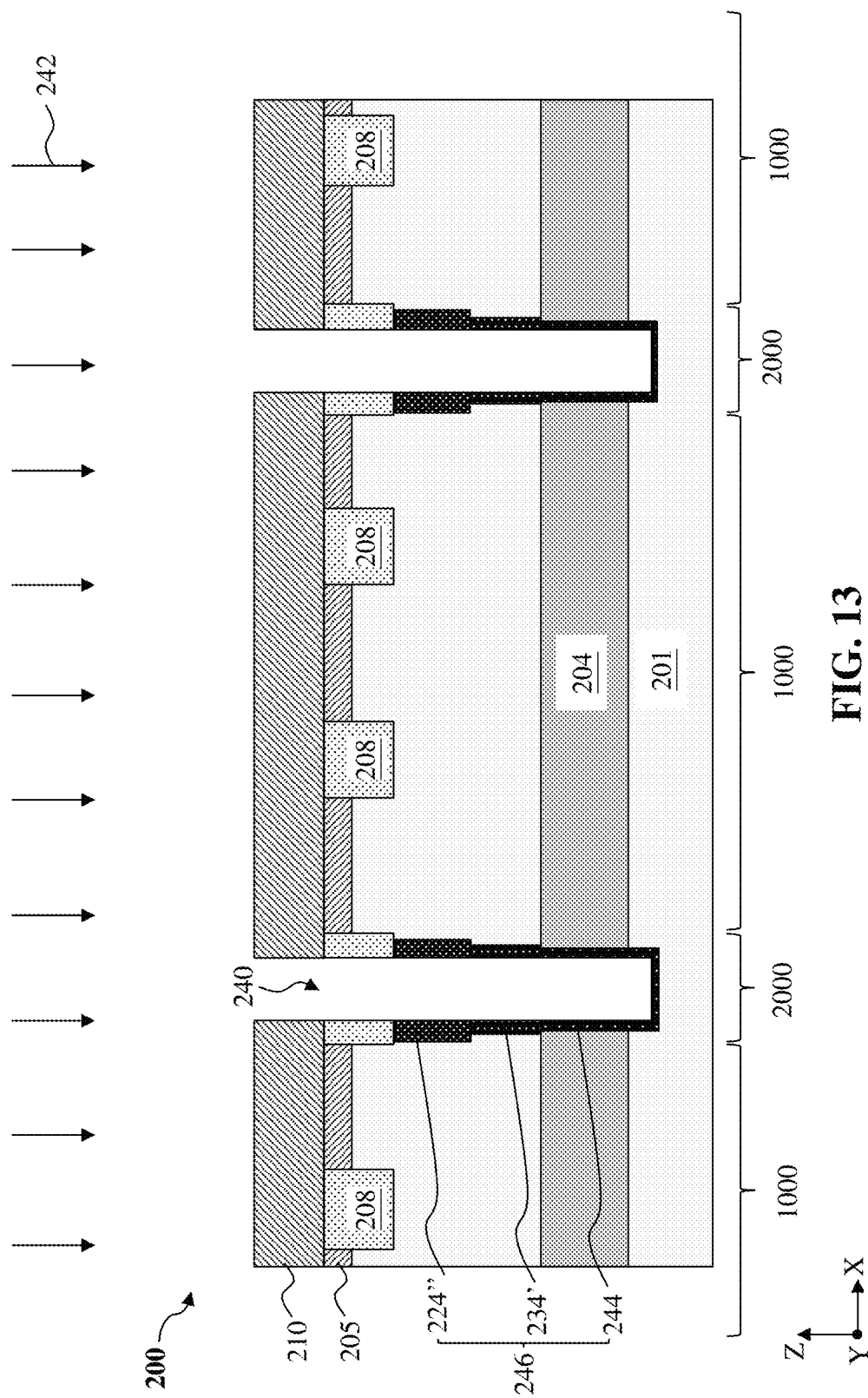

Referring to FIGS. 1 and 13, method 100 includes a block 118 where a third plasma doping process 242 is performed to the workpiece 200. The third plasma doping process 242 implants portions of the substrate 201 uniformly along the sidewall and bottom surfaces of the third trench 240 with one or more ion species. In the present embodiment, the third plasma doping process 242 may be performed by implanting appropriate p-type dopants (e.g., boron, BF2). In an embodiment, an implant dosage of the third plasma doping process 242 is equal to or substantially equal to the implant dosage of the second plasma doping process 232. In some other embodiments, the implant dosage of third plasma doping process 242 may be different from the implant dosage of the second plasma doping process 232. The third plasma doping process 242 forms a third sidewall doped region along the whole sidewall of the third trench 240. Since the sidewall surface of the third trench 240 includes the sidewall surface of the second trench 230 that exposes the first doped region 224' and the second doped region 234, the third plasma doping process 242 forms the third sidewall doped region that includes an upper portion overlapping with the first doped region 224', a middle portion overlapping with the second doped region 234, and a lower doped region 244 near the sidewall surface S4. That is, the third plasma doping process 242 not only forms a new doped region 244 near the sidewall surface S4, but also implants dopants into the first doped region 224' and the second doped region 234. As such, due to the performing of the third plasma doping process 242, the dopant concentrations of the first doped region 224' and the dopant concentration of the second doped region 234 increase. The first doped region 224' after the performing of the third plasma doping process 242 may be referred to as the first doped region 224". The second doped region 234 after the performing of the third plasma doping process 242 may be referred to as the second doped region 234'. The doped region 244 may be referred to as a third doped region 244. Accordingly, a dopant concentration of the first doped region 224" is greater than a dopant concentration of the second doped region 234', and the dopant concentration of the second doped region 234' is greater than a dopant concentration of the third doped region 244. In an embodiment, the dopant concentration of the third doped region 244 is greater than the dopant concentration of the first blanket doped region 204 such that holes are accumulated at the sidewall surface S4 of the third trench 240 during operation. The first doped region 224", the second doped region 234', and the third doped region 244 may be collectively referred to as a doped region 246 or a p-type region 246. Therefore, a dopant concentration of the p-type region 246 is not uniform throughout its depth along the Z direction and has a gradient profile that increases along the Z direction. The doping polarity of the doped region 246 is opposite to the doping polarity of the first blanket doped region 204.

Figure 14:
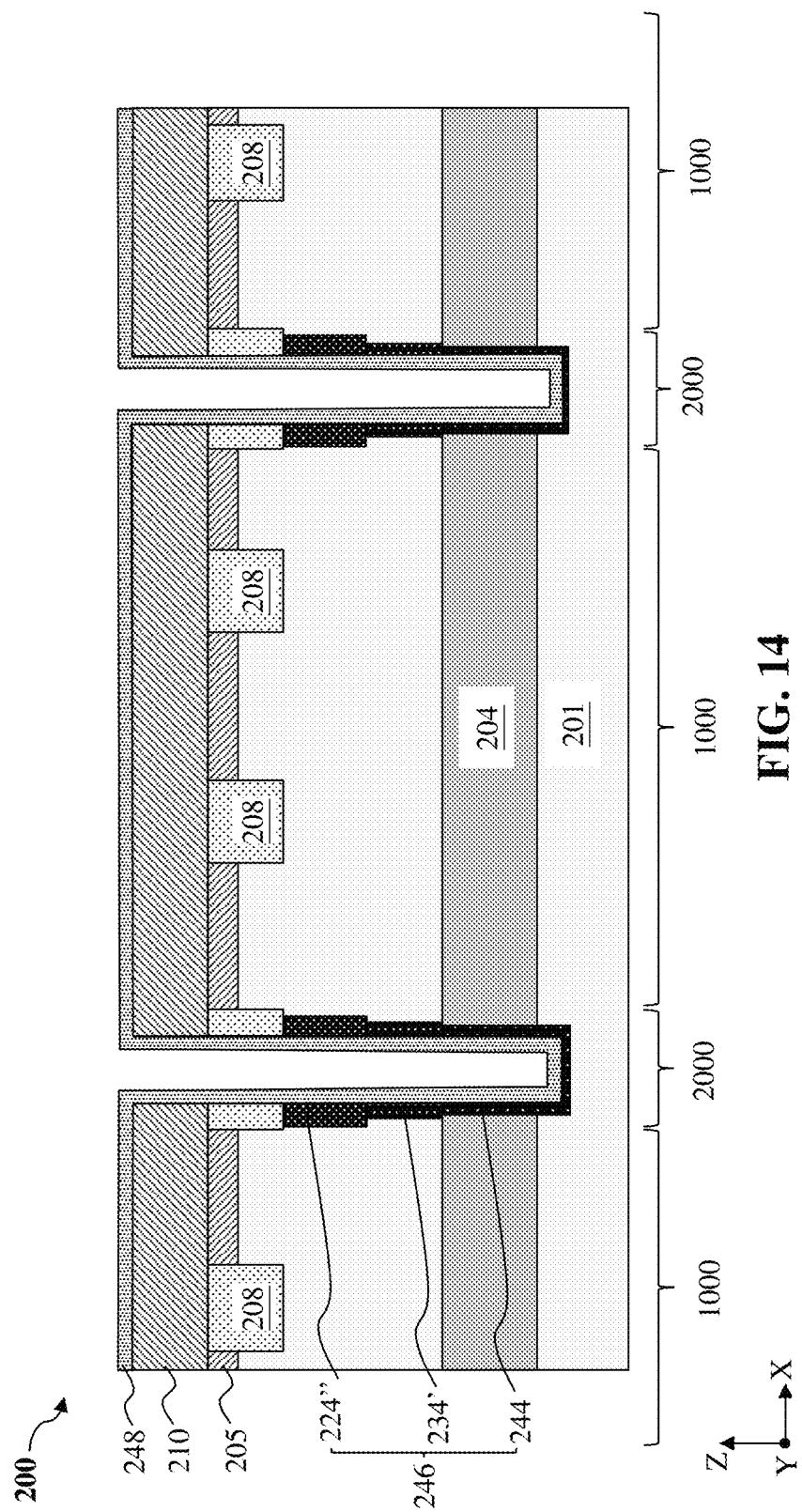

Referring to FIGS. 1 and 14, method 100 includes a block 120 where a dielectric liner 248 is formed in the third trench 240. In some embodiments, the dielectric liner 248 may include low-k dielectric materials such as silicon oxide, high-k (having a dielectric constant greater than that of silicon oxide, which is approximately 3.9) dielectric materials such as silicon nitride, hafnium oxide, titanium oxide, zirconium oxide, silicon oxynitride, combinations thereof, or other suitable materials. The dielectric liner 248 may be formed using a suitable method, such as atomic layer deposition (ALD), chemical vapor deposition (CVD), thermal oxidation, or other suitable methods. In embodiments represented in FIG. 14, the dielectric liner 248 is conformally formed over the workpiece 200 by a deposition process. The term "conformally" may be used herein for ease of description of a layer having a substantially uniform thickness over various regions. In embodiments where the dielectric liner 248 is formed by a thermal oxidation, the dielectric liner 248 may be thus only formed on surfaces of semiconductor regions (e.g., surface of the p-type region 246) exposed by the third trench 240. That is, the dielectric liner 248 may not extend along sidewall surfaces of the first STI structure 206 in such embodiments. In some embodiments, the dielectric liner 248 may be a multi-layer structure. For example, the formation of the dielectric liner 248 may include forming a first liner layer and conformally depositing a second liner layer over the first liner layer. The first liner layer may be formed by thermal oxidation, and the second liner layer may be formed by a deposition process.

Figure 15:
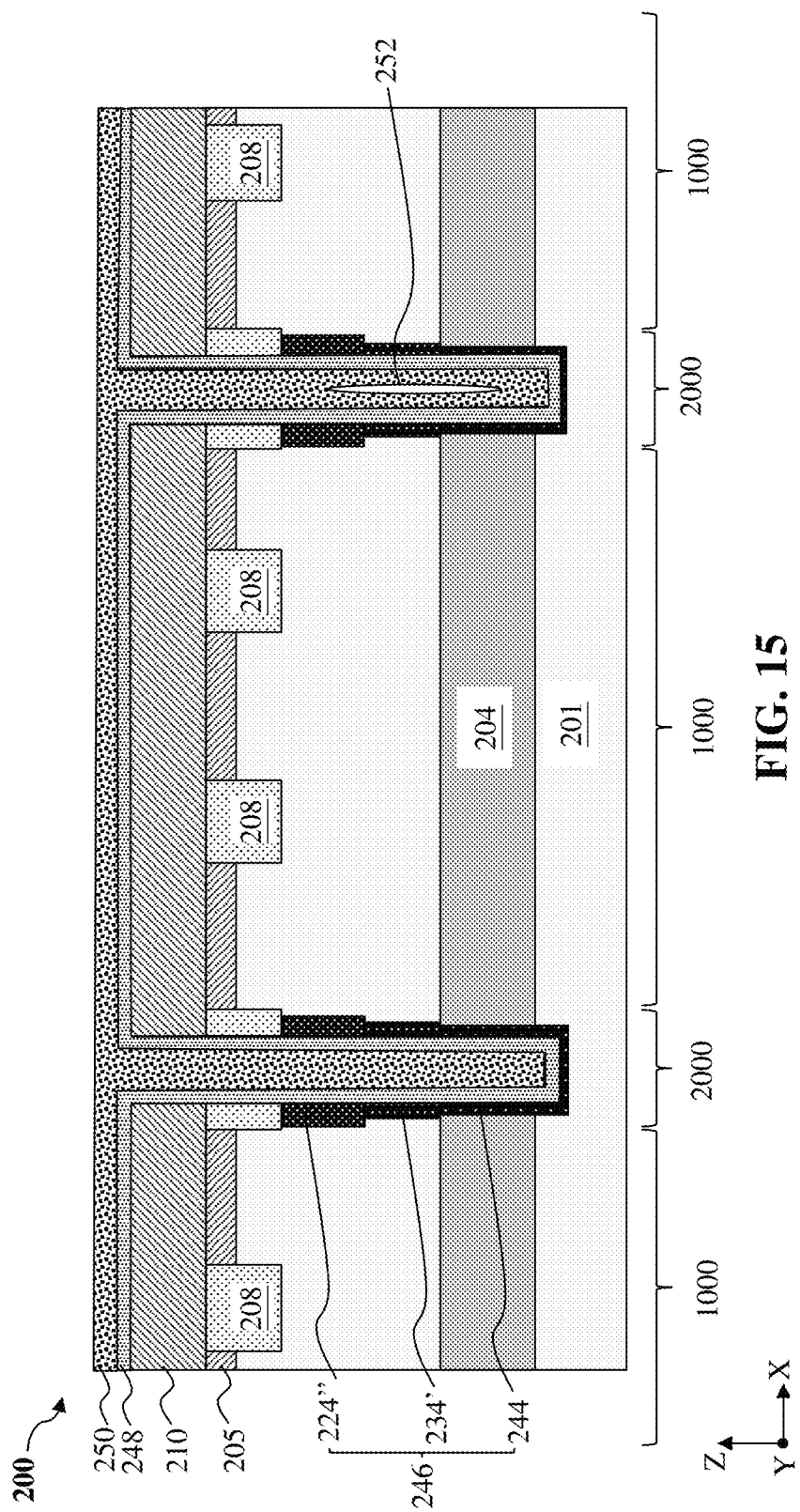

Referring to FIGS. 1 and 15, method 100 includes a block 122 where a conductive layer 250 is deposited over the workpiece 200 to substantially fill the third trench 240. In some embodiments, the conductive layer 250 may include doped polycrystalline silicon, titanium nitride, aluminum, tungsten, other suitable materials, or combinations thereof and may be deposited using processes such as CVD, ALD, or other suitable processes. In an embodiment, the conductive layer 250 includes doped polycrystalline silicon, and a doping polarity of the conductive layer 250 is opposite to the doping polarity of the first blanket doped region 204. In some embodiments, the conductive layer 250 may be a multi-layer structure. For example, the deposition of the conductive layer 250 may include conformally depositing a first conductive layer over the dielectric liner 248 and conformally depositing a second conductive layer over the first conductive layer. A composition of the second conductive layer is different than a composition of the first conductive layer, for example, to increase the reflectivity of the to-be-formed DTI structure 262 (shown in FIG. 20). In some embodiments, the workpiece 200 may include a seam (or air gap or void) 252 sealed or surrounded by the conductive layer 250, as shown in FIG. 15.

Figure 16:
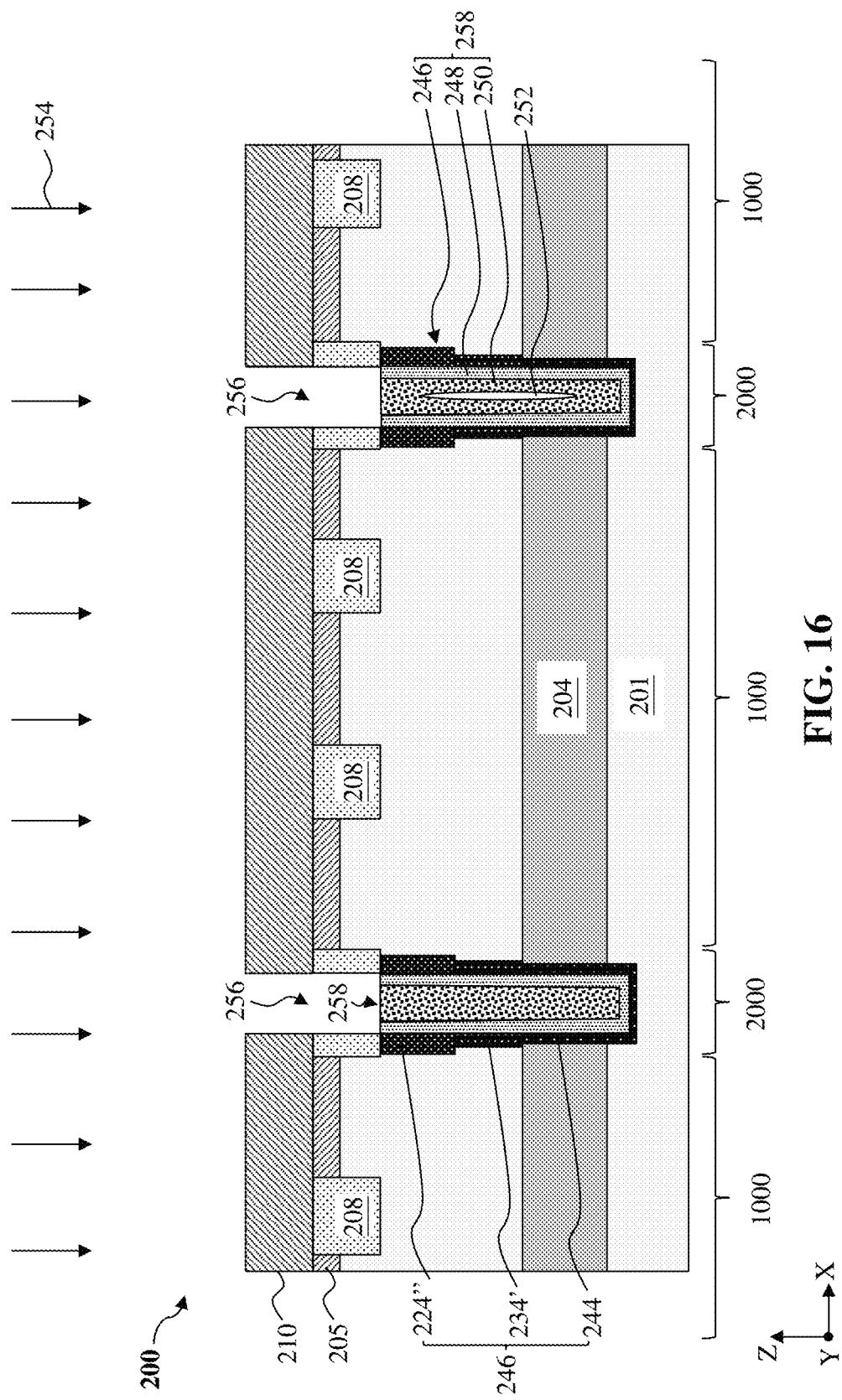

Referring to FIGS. 1 and 16, method 100 includes a block 124 where the conductive layer 250 and the dielectric liner 248 are etched back by an etching process 254 to form a recess 256. In an embodiment, the etching process 254 not only selectively etches portions of the conductive layer 250 and the dielectric liner 248 over the hard mask layer 210 without substantially etching the hard mask layer 210 but also removes portions of the conductive layer 250 and the dielectric liner 248 that fill the opening 216 to form the recess 256. The etching process 254 may be a dry etching process, a wet etching process, or a combination thereof that implements a suitable etchant. The depth of the recess 256 may be controlled by duration of the etching process 254. In embodiments represented in FIG. 16, a depth of the recess 256 is substantially equal to the depth of the first STI structure 206 to prevent or reduce any current leakage at the front side of the workpiece 200. That is, a bottom surface of the first STI structure 206 may be substantially coplanar with a top surface of the isolation structure 258. The recessed conductive layer 250, the recessed dielectric liner 248, and the doped region 246 may be collectively referred to as an isolation structure 258. In some embodiments, the isolation structure 258 may include the seam 252.

Figure 17:
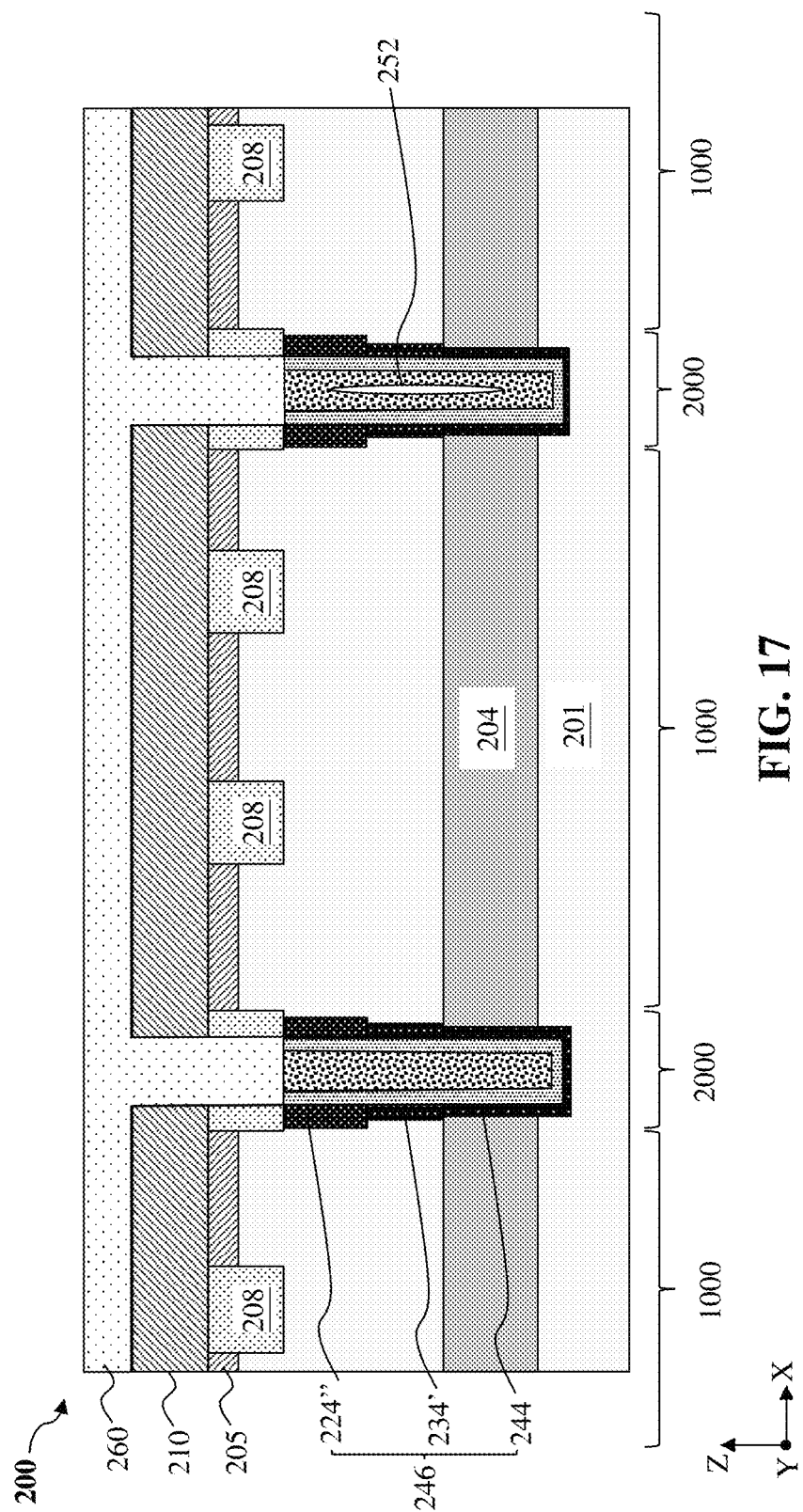
Figure 18:
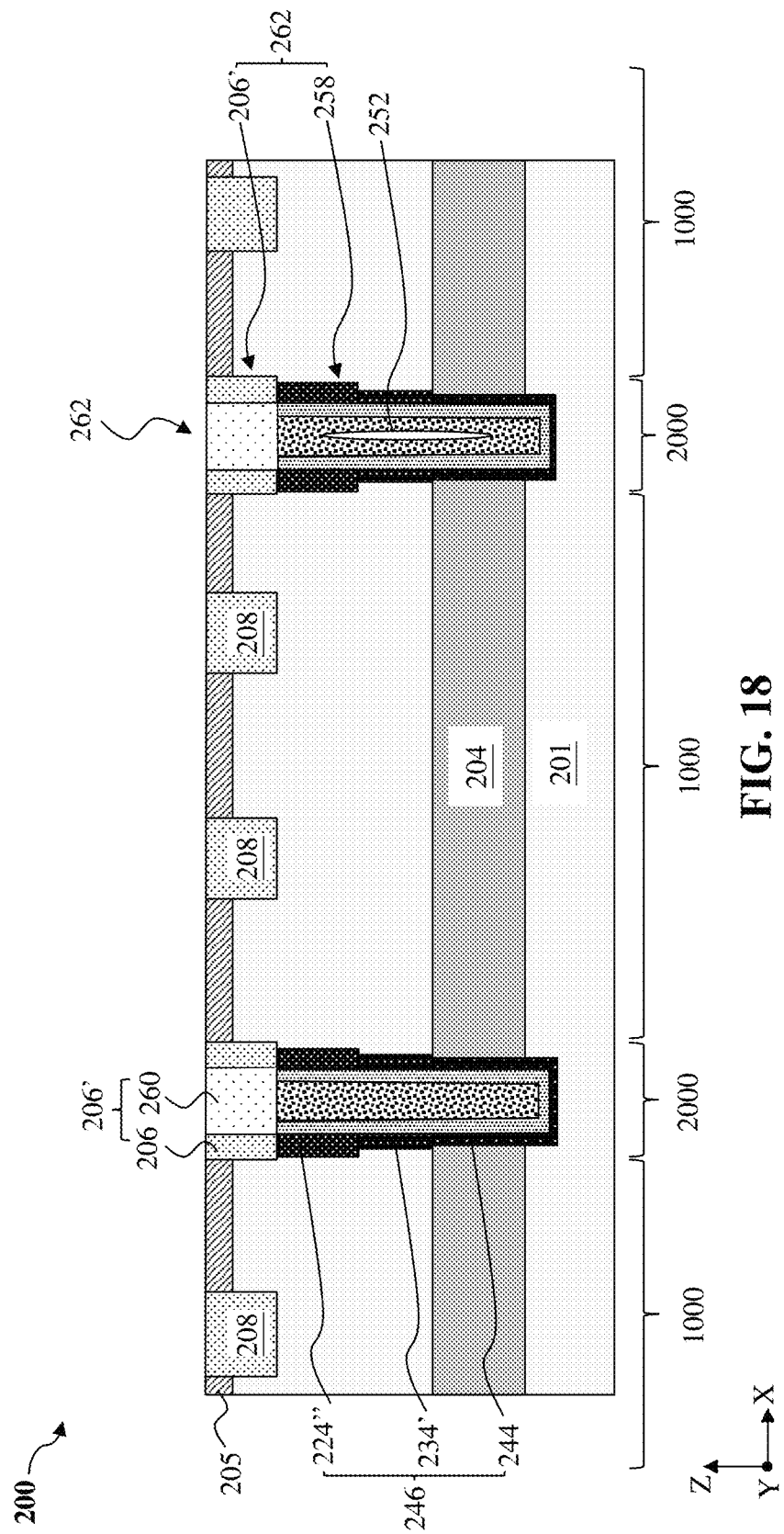
Figure 19:
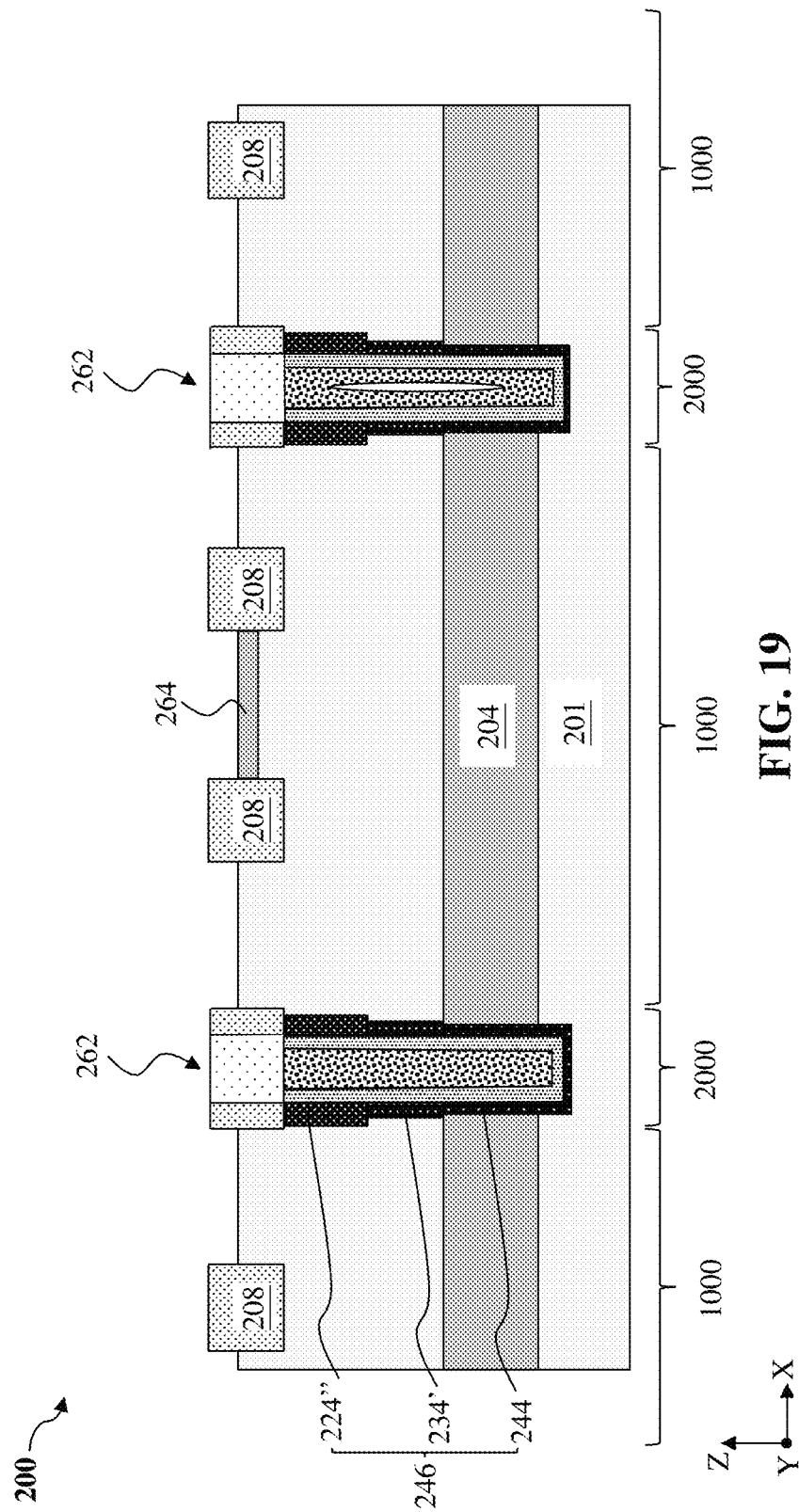
Figure 20:
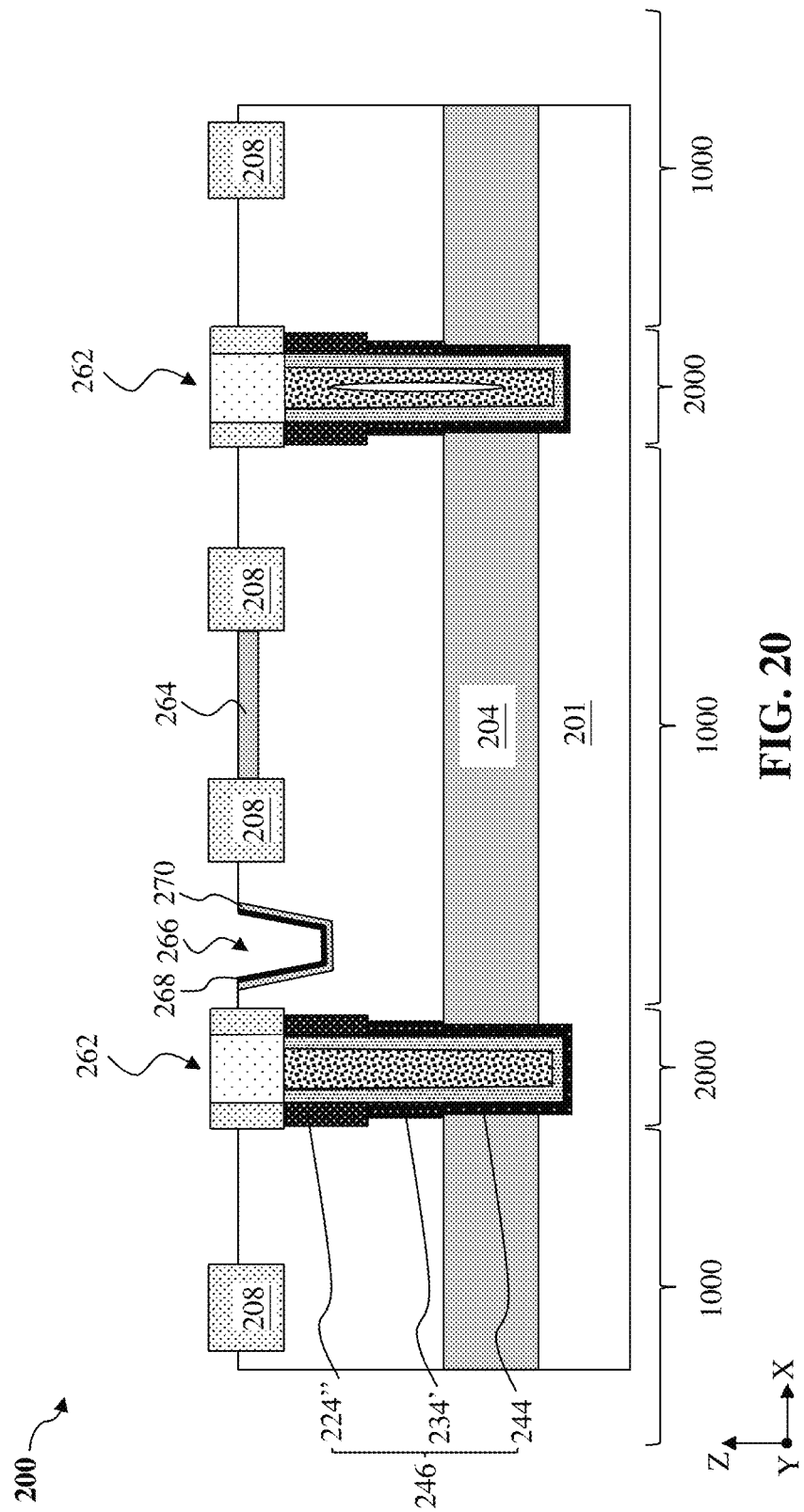

Referring to FIGS. 1 and 17, method 100 includes a block 126 where a dielectric layer 260 is deposited over the workpiece 200 to refill the recess 256. The dielectric layer 260 may be referred to as a refill layer 260. The dielectric layer 260 is deposited over the workpiece 200 and in the recess 256 using a suitable method, such as ALD, CVD, or other suitable methods and may include silicon oxide, silicon nitride, silicon oxycarbide, silicon oxycarbonitride, silicon carbonitride, metal nitride, or a suitable dielectric material. In some embodiments, a composition of the dielectric layer 260 may be the same as a composition of the first STI structure 206. For example, both the first STI structure 206 and the dielectric layer 260 may include silicon oxide. In some embodiments, a composition of the dielectric layer 260 may be different than a composition of the first STI structure 206.

A planarization process is then performed to remove excess dielectric material of the dielectric layer 260 and the hard mask layer 210 over the protective layer 205, leaving the dielectric layer 260 in the recess 256. The planarization process may include a CMP process and may stop when it reaches the top surface of the protective layer 205. The conductive layer 250 and the dielectric liner 248 of the isolation structure 258 are thus capped by the dielectric layer 260, leading to a reduced current leakage. The first STI structure 206 and the dielectric layer 260 formed in the recess 256 may be collectively referred to as the first STI structure 206'. The first STI structure 206' and the isolation structure 258 may be collectively referred to as a deep trench isolation (DTI) structure 262. After forming the DTI structure 262, the protective layer 205 may be selectively removed (e.g., using etchants that include phosphoric acid) to expose the first surface 201a of the substrate 201.

After exposing the first surface 201a of the substrate 201, components such as photodiode and transistors (e.g., transfer transistor, reset transistor, source follower) of a pixel (not explicitly shown) may be formed in each pixel region 1000. For example, after exposing the first surface 201a of the substrate 201, a p-type well (not shown) may be formed in the substrate 201 for forming n-type transistors therein. The p-type well may be arranged above the first blanket doped region 204 and may be formed by an ion implantation process using a mask film (e.g., a patterned photoresist layer) or by a blanket doping process without using a mask film. In some embodiments, an ion implantation process may be further performed to form a threshold voltage (Vt) implant region (e.g., region 264) to adjust the threshold voltage of transistors to be formed in the pixel region 1000. Mask films (e.g., patterned photoresist layer or patterned hard mask) may be formed to facilitate the formation of the Vt implant region 264.

In various embodiments, a pixel may include a transfer transistor. A gate structure of the transfer transistor may be referred to as a transfer gate. The transfer gate may be a vertical gate structure or a lateral gate structure. In embodiments described below with reference to FIGS. 20-23 and FIGS. 25-28, the transfer gate includes a vertical gate structure. Now referring to FIG. 20, after exposing the first surface 201a of the substrate 201, an etching process may be performed to form a gate trench 266 at the first surface 201a of the substrate 201. An interfacial layer 268 may be formed in the gate trench 266. The interfacial layer 268 may include silicon oxide and may be formed by various processes such as thermal oxidation. In some embodiments, a doped region 270 may be formed around sidewalls of the gate trench 266 by a suitable process such as ion implantation to passivate the sidewall of the to-be-formed gate structure 288 (shown in FIG. 25) to suppress dark current and white pixels.

Figure 21:
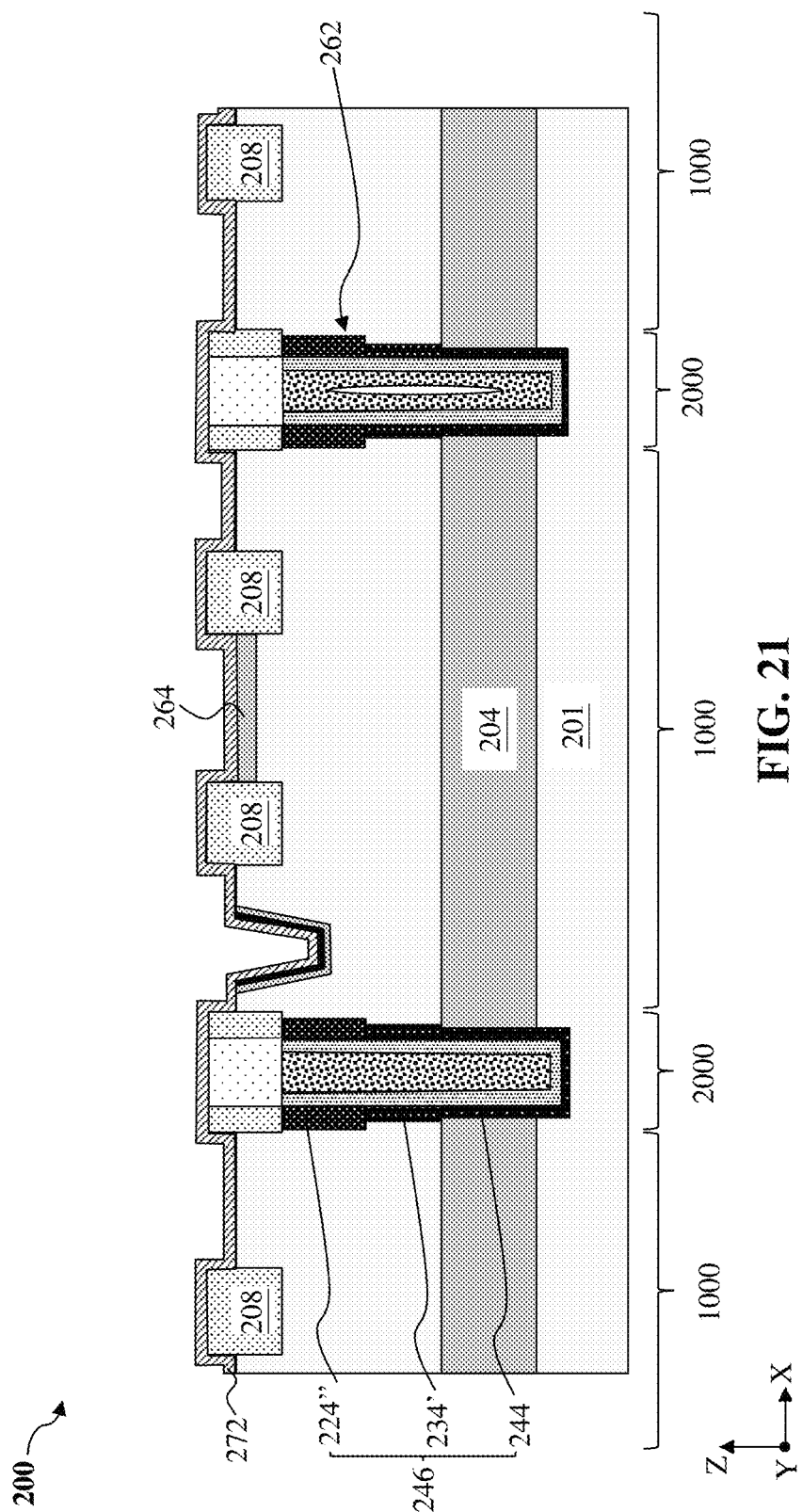

Referring to FIG. 21, after forming the gate trench 266, a gate dielectric layer 272 is deposited over the workpiece 200 and partially fills the gate trench 266. The gate dielectric layer 272 may be deposited over the workpiece 200 (including the interfacial layer 268) using an ALD, CVD, and/or other suitable methods and may include low-k dielectric materials such as silicon oxide, high-k (having a dielectric constant greater than that of silicon oxide, which is approximately 3.9) dielectric materials such as silicon nitride, hafnium oxide, titanium oxide, zirconium oxide, silicon oxynitride, combinations thereof, or other suitable materials.

Figure 22:
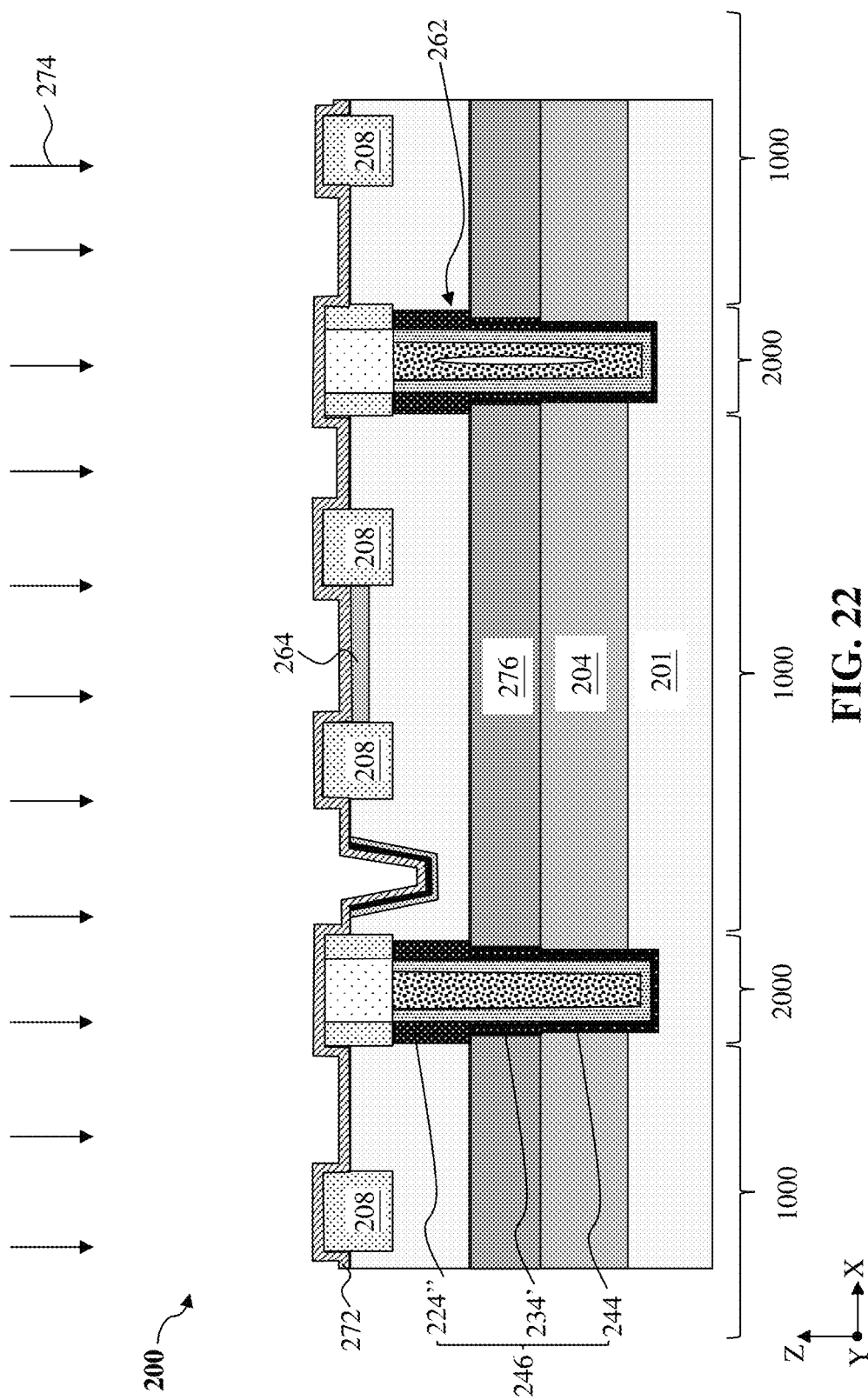
Figure 23:
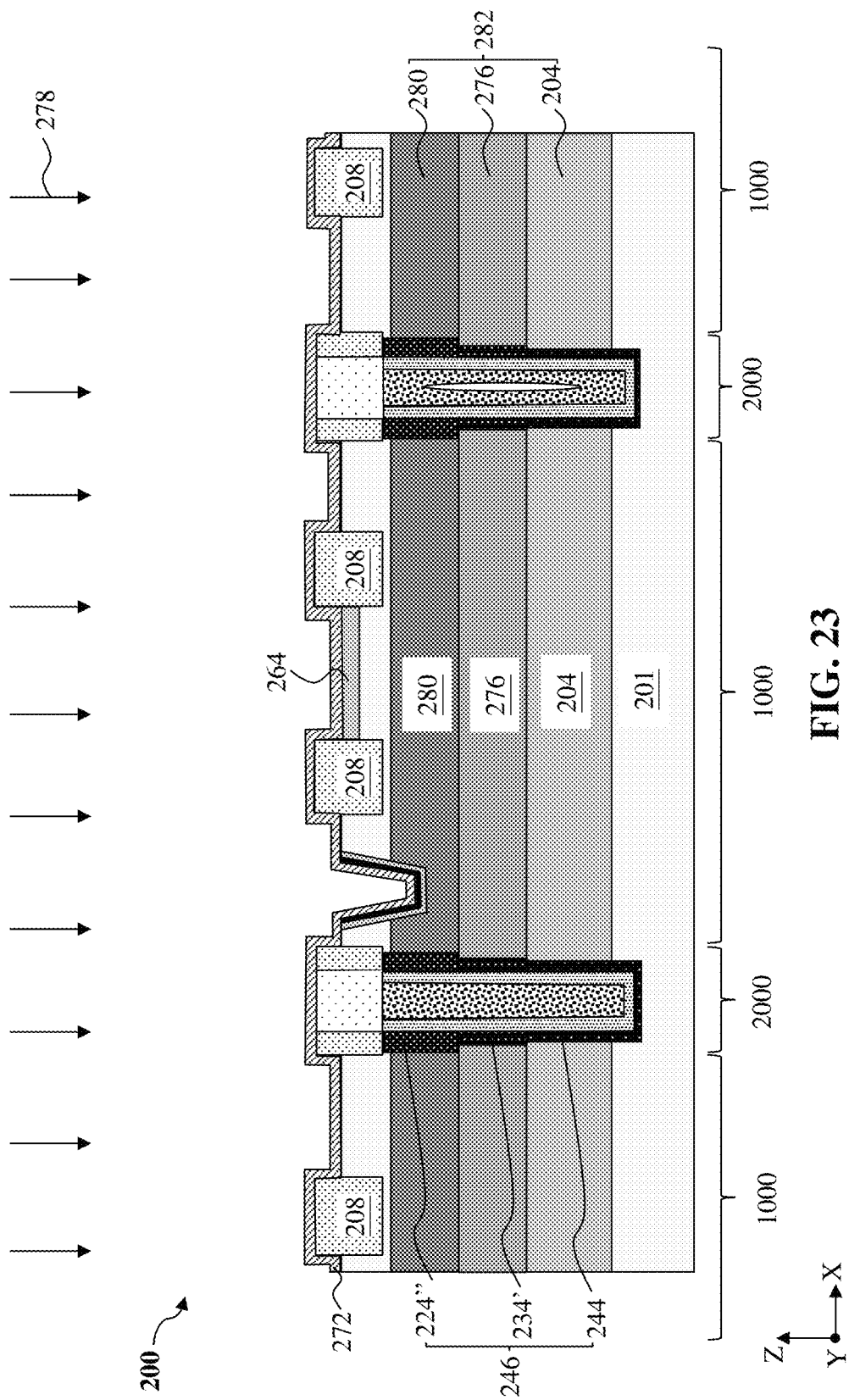
Figure 24:
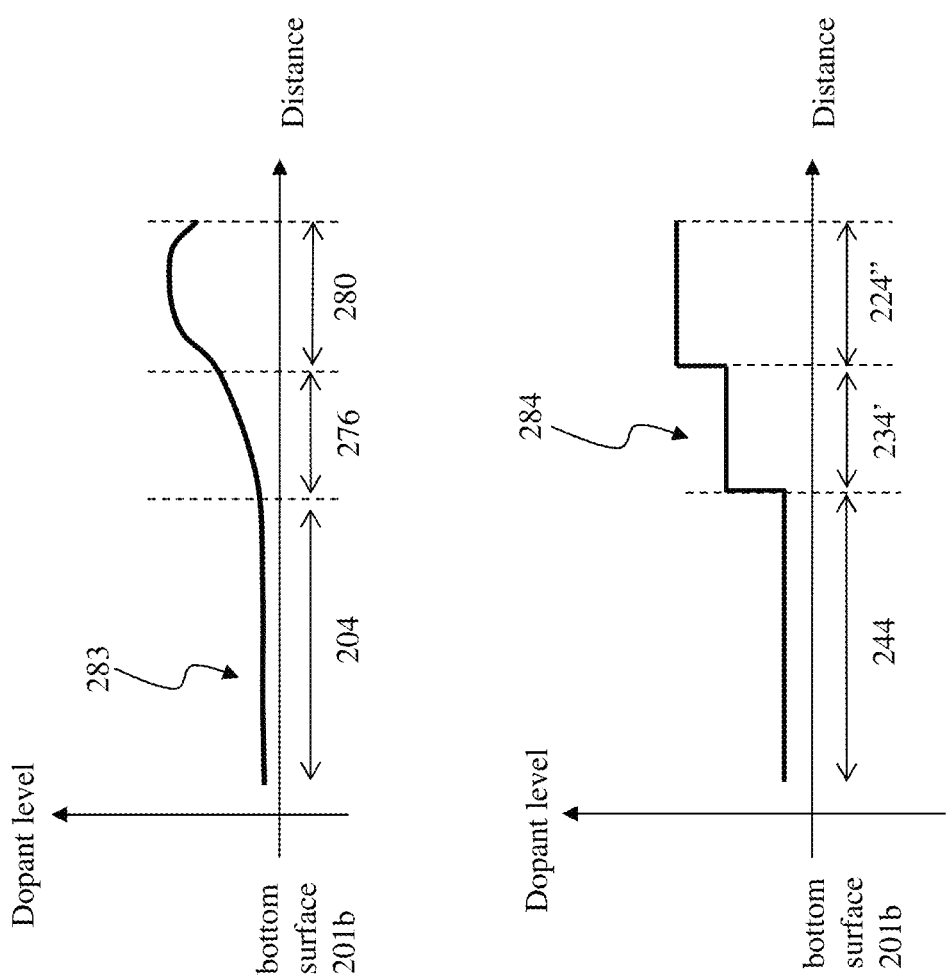
FIG. 24 illustrates exemplary doping profiles for regions in the semiconductor device.

Referring to FIGS. 1 and 22-23, method 100 includes a block 128 where one or more blanket doping processes are performed to the workpiece 200 to complete the formation of an n-type region 282 of a photodiode in the pixel region 1000. The n-type region 282 may be referred to as a blanket doped region 282. In embodiments represented in FIGS. 22-23, operations in block 128 includes performing a second blanket doping process 274 to form a doped region 276 in the substrate 201 and a third blanket doping process 278 to form a doped region 280 in the substrate 201 to complete the formation of the blanket doped region 282 in the pixel region 1000. The blanket doped region 282 includes the doped regions 204, 276, and 280. The doped region 276 may be referred to as a second blanket doped region 276 or a doped middle region 276. The doped region 280 may be referred to as a third blanket doped region 280 or a doped upper region 280. The second blanket doping process 274 and the third blanket doping process 278 may be in a way similar to the first blanket doping process 203 such as implanting appropriate n-type dopants (e.g., phosphorus (P) or Arsenic (As)) at a corresponding implant dosage. The doped upper region 280 and the doped middle region 276 have a doping polarity same as the doping polarity of the doped lower region 204. In an embodiment, a dopant concentration of the second blanket doped region 276 is greater than a dopant concentration of the first blanket doped region 204 and is smaller than a dopant concentration of the third blanket doped region 280, thereby forming a desired doping profile for the blanket doped region 282.

The performing of the second blanket doping process 274 is controlled such that a depth and a range of the doped middle region 276 are substantially equal to a depth and a range of the second doped region 234'. That is, the location of the doped middle region 276 is controlled to match or substantially match the location of the second doped region 234'. In other words, a top surface and a bottom surface of the doped middle region 276 are substantially coplanar with a top surface and a bottom surface of the second doped region 234', respectively. Similarly, the performing of the third blanket doping process 278 is controlled such that a top surface and a bottom surface of the doped upper region 280 are substantially coplanar with a top surface and a bottom surface of the first doped region 224", respectively.

It is noted that three blanket doping processes (i.e., the first blanket doping process 203, the second blanket doping process 274, the third blanket doping process 278) are used to form the blanket doped region 282 of the photodiode, which are for illustrative purposes only and not intended to limit the present disclosure to what is explicitly illustrated therein. It is understood that any suitable number of blanket doping processes can be performed in block 128. The number of the blanket doping processes in block 128 depends on the desired doping profile of the photodiode.

FIG. 24 further shows doping profiles of the n-type dopant in the blanket doped region 282 of the photodiode and the p-type dopant in the doped region 246 according to an embodiment. Referring to FIG. 24, curves 283 and 284 illustrate the doping profiles of the n-type dopant and p-type dopant, respectively. The dopant level (or dopant concentration) of the p-type dopant in the doped region 246 is not uniform throughout its depth along the Z direction, and the dopant level (or dopant concentration) of the n-type dopant in the blanket doped region 282 of the photodiode is not uniform throughout its depth along the Z direction. The dopant concentrations of the n-type dopant in the blanket doped region 282 of the photodiode and the p-type dopant in the doped region 246 are functions of a distance to the bottom surface 201b of the substrate 201. The closer to the bottom surface 201b, the smaller the dopant concentrations. Put differently, the closer to the first surface 201a, the greater the dopant concentrations. In the present embodiment, the dopant concentration of the first blanket doped region 204 is smaller than the dopant concentration of the third doped region 244, the dopant concentration of the second blanket doped region 276 is smaller than the dopant concentration of the second doped region 234', and the dopant concentration of the third blanket doped region 280 is smaller than the dopant concentration of the first doped region 224". Therefore, holes may accumulate at the sidewall surface of the isolation structure 258 (shown in FIG. 16), reducing or eliminating defects such as dangling bonds, thereby reducing the dark current and white pixels without compromising other aspects of the design requirements.

Figure 25:
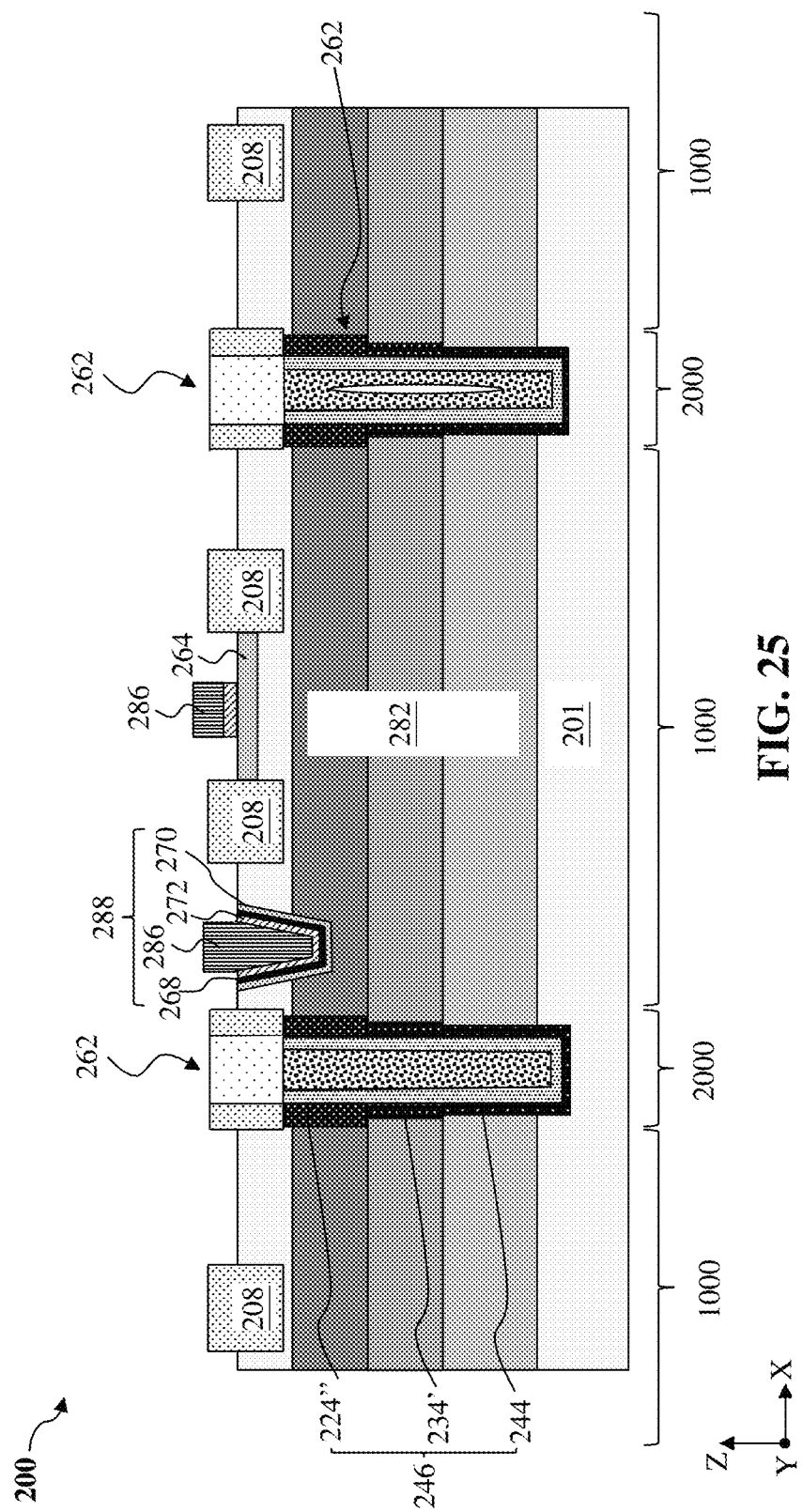

In the present disclosure, as shown in FIG. 25, after completing the formation of the blanket doped region 282 of the photodiode, a gate electrode layer 286 may be deposited over the gate dielectric layer 272. The gate electrode layer 286 may include doped polysilicon, titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC), aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or combinations thereof. In various embodiments, the gate electrode layer 286 may be formed by ALD, PVD, CVD, e-beam evaporation, or other suitable process. The gate electrode layer 286 and the gate dielectric layer 272 may be patterned to form gate structures such as the transfer gate structure 288 in the gate trench 266. It is understood that gate structures (e.g., transfer gate structure 288) shown in FIG. 25 are for illustration purpose only and are not intended to limit the present disclosure to what is explicitly illustrated therein. After forming the patterned gate structures, further processes such as forming spacers along sidewalls of the gate structures, lightly doped source/drain (LDD) regions, heavily doped source/drain regions may be performed to complete the formation of transistors in the pixel regions 1000. In the present embodiments, the lightly doped source/drain (LDD) regions and the heavily doped source/drain regions (S/D) may include n-type dopants.

Figure 26:
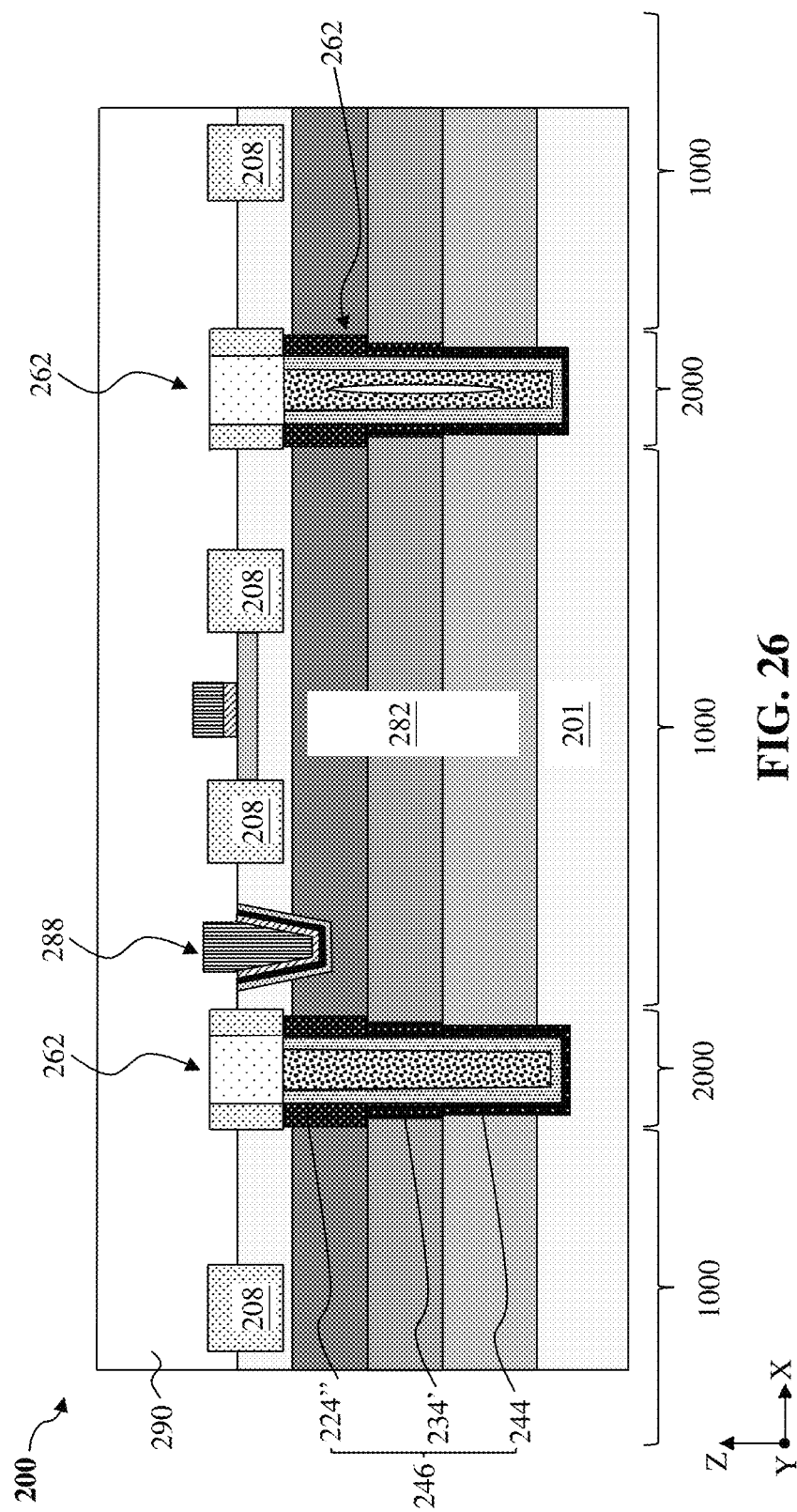
Figure 27:
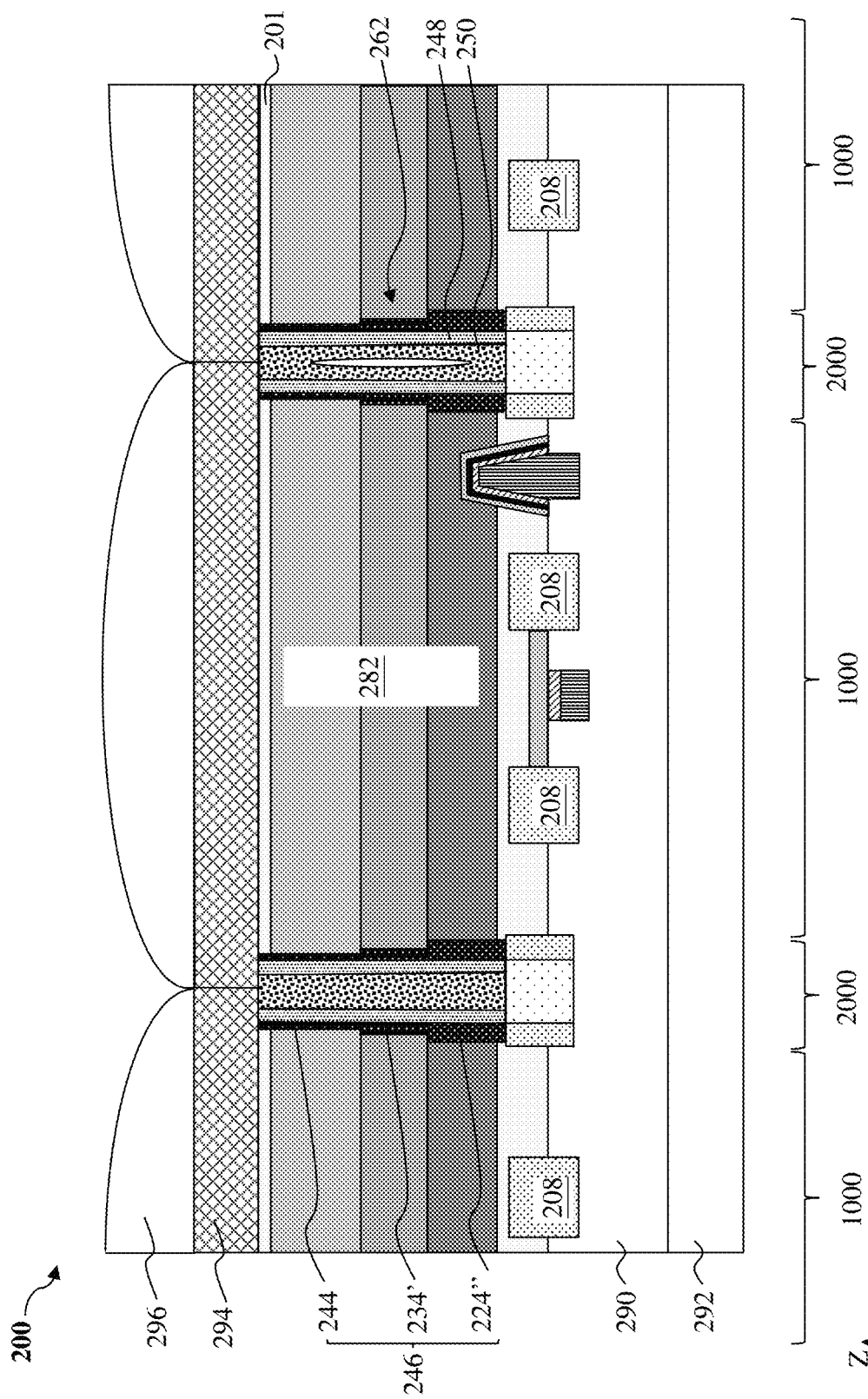

Referring to FIGS. 1 and 26-27, method 100 includes a block 130 where further processes may be performed to complete the fabrication of the semiconductor device 200. Such further process may include forming an interconnect structure 290 over the first surface 201a of the substrate 201. In some embodiments, the interconnect structure 290 may include multiple interlayer dielectric (ILD) layers and multiple metal lines or contact vias in each of the ILD layers. The metal lines and contact vias in each ILD layer may be formed of metal, such as aluminum, tungsten, ruthenium, or copper. Because the interconnect structure 290 is formed over the front side of the workpiece 200, the interconnect structure 290 may also be referred to as a front-side interconnect structure 290. In embodiments where the substrate 201 is a p-type substrate, a negative voltage may be applied to the conductive layer 250 to further induce hole accumulation at the sidewall of the isolation structure 258 to isolate the dangling bonds and/or defects at the interface between the substrate 201 and the isolation structure 258, thereby reducing dark current and white pixels. The negative voltage may be applied to the conductive layer 250 via the metal lines and contact vias in the interconnect structure 290. In embodiments where the substrate 201 is an n-type substrate, a positive voltage may be applied to the conductive layer 250 to induce electron accumulation at the sidewall of the isolation structure 258.

Referring to FIG. 27, after forming the interconnect structure 290, another substrate 292 is bonded to or attached to the interconnect structure 290. In some embodiments, the substrate 292 may be bonded to the workpiece 200 by fusion bonding, by use of an adhesion layer, or by other bonding methods. In some instances, the substrate 292 may be a carrier substrate and may include semiconductor materials (such as silicon), sapphire, glass, polymeric materials, or other suitable materials. In some embodiments, the substrate 292 may include application specific integrated circuits (ASIC). The workpiece 200 is then flipped over, as shown in FIG. 27, where the substrate 201 is at the top and is disposed over the interconnect structure 290. The workpiece 200 is thinned, planarized, recessed, or grinded from the second surface 201b until the conductive layer 250 in the DTI structure 262 is exposed. The DTI structure 262 that includes the isolation structure 258 and the first STI structure 206' extends completely through the substrate 201 and may be referred to as a full DTI (FDTI) structure 262. The pixel formed in a pixel region 1000 is then electrically and optically isolated from pixels in adjacent pixel regions 1000 by the FDTI structures 262. Processes such as forming color filters 294 and micro-lenses 296 may also be performed. Other suitable processes may be further performed to finish the fabrication of the semiconductor device 200, which is a back-side illuminated image sensor in an embodiment.

In the above embodiments, the p-type region 246 is formed between the performing of the first blanket doping process 203 and the performing of the second blanket doping process 274. In some other implantations, the regions (e.g., regions 224", 234' and 244) in the p-type region 246 and the regions (e.g., regions 204, 277 and 280) in the n-type region 282 may be formed sequentially in any order. For example, the p-type region 246 may be formed before the performing of the first blanket doping process 203. In other alternative embodiments, the p-type region 246 may be formed after forming the blanket doped region 282. In the above embodiments, the doped region 246 in the isolation region 2000 includes p-type dopants, the photodiode and the transistors include n-type dopants. In some other embodiments, the doped region 246 in the isolation region 2000 may include n-type dopants, and the photodiode and the transistors in the pixel region 1000 may include p-type dopants.

Figure 28:
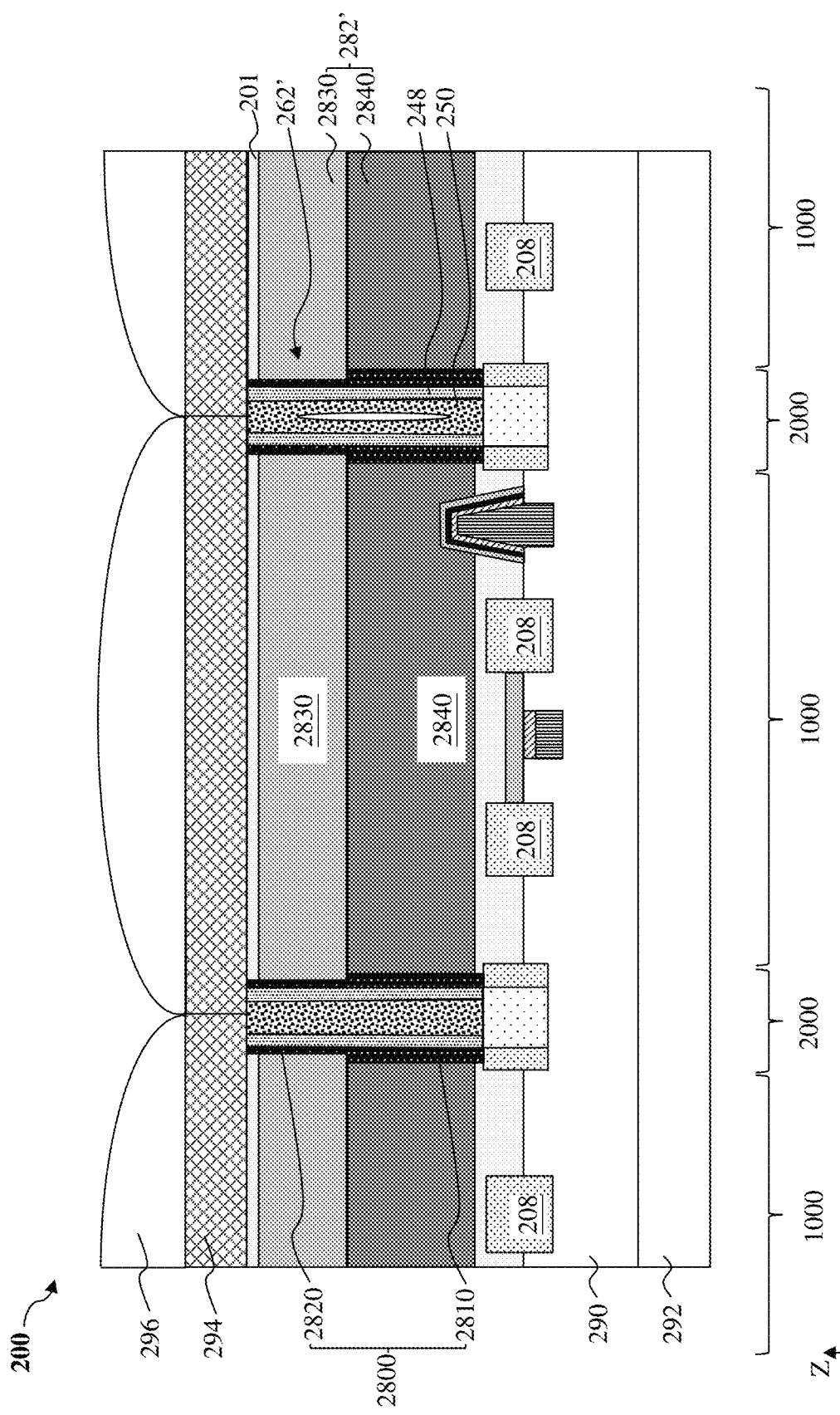

In the above embodiments, the p-type region 246 (shown in FIG. 13) of the DTI structure 262 is formed by performing the first etching process 218 (shown in FIG. 7), the first plasma doping process 222 (shown in FIG. 8), the second etching process 228 (shown in FIG. 10), the second plasma doping process 232 (shown in FIG. 11), the third etching process 238 (shown in FIG. 12), and the third plasma doping process 242 (shown in FIG. 13). It is noted that the number of etching processes and the number of plasma doping processes are just examples and are not intended to limit the present disclosure to what is explicitly illustrated therein. For example, the p-type region 246 may be formed by performing a number M of etching processes, and each etching process of the number M of etching processes is followed by a plasma doping process, where M is not less than 2. For example, M may be between 2 and 10. More specifically, an $(i-1)^{th}$ etching process is performed to form a trench, and an $(i-1)^{th}$ plasma doping process is followed to form a doped region along the whole sidewall and bottom surfaces of the trench. Then, an $i^{th}$ etching process may extend the trench formed by the $(i-1)^{th}$ etching process further into the substrate and an $i^{th}$ plasma doping process is performed after the $i^{th}$ etching process. The $i^{th}$ plasma doping process not only forms a new doped region along the sidewall and bottom surfaces of the extended portion of the trench formed by the $i^{th}$ etching process, but also implants dopants to the doped region previously formed by the $(i-1)^{th}$ plasma doping process, $2 \leq i \leq M$. In some embodiments, the number M is determined by the desired doping profile of the blanket doped region 282 formed in the pixel region 1000 such that satisfactory hole accumulation is achieved at the sidewall of the isolation structure 258 (shown in FIG. 16) without compromising other aspects of the device performances. FIG. 28 depicts a cross-sectional view of the semiconductor device 200 that includes two neighboring n-type regions 282' isolated by a DTI structure 262'. The DTI structure 262' is in a way similar to the DTI structure 262 except that the DTI structure 262' includes a p-type region 2800 having a p-type region 2810 and a p-type region 2820 formed by two etching processes and two plasma doping process in a way similar to the formation of the p-type region 246 (shown in FIG. 26). The region 282' is in a way similar to the region 282 and includes an n-type region 2830 and an n-type region 2840 formed by blanket doping processes. In an embodiment, a dopant concentration of the p-type region 2810 is greater than a dopant concentration of the p-type region 2820 and a dopant concentration of the n-type region 2840, and the dopant concentration of the n-type region 2840 is greater than a dopant concentration of the n-type region 2830, and the dopant concentration of the p-type region 2820 is greater than a dopant concentration of the n-type region 2830. It is noted that, while boundaries of the various doped regions are described and depicted as having perfectly straight lines, boundaries of the doped regions in reality may be blurred. That said, the shapes of the doped regions may still be discerned and detected by dopant types, dopant concentrations, and types of devices fabricated thereon.

Although not intended to be limiting, one or more embodiments of the present disclosure provide many benefits to image sensors and an imaging system. For example, by forming the DTI structure, a pixel may be both electrically and optically isolated from its neighboring pixels. Optical cross talk may be advantageously reduced or even substantially eliminated. By providing the DTI structure having a p-type region with a gradient doping profile along a sidewall surface thereof, holes may accumulate at the sidewall surface of the DTI structure, leading to an increased passivation, thereby reducing the dark current and white pixels without compromising other aspects of the device. In addition, satisfactory gradient doping profiles of the p-type region along the sidewall surface of the DTI structure and the n-type region in the photodiode in small pixels are formed by blanket doping processes or self-aligned plasma doping processes that are mask-less processes, rather than using photolithography processes that require high resolution, leading to reduced fabrication costs. Further, the disclosed methods can be easily integrated into existing semiconductor manufacturing processes.

The present disclosure provides for many different embodiments. Semiconductor structures and methods of fabrication thereof are disclosed herein. In one exemplary aspect, the present disclosure is directed to a method of forming an image sensor device. The method includes performing a first etching process to remove a portion of a substrate, thereby forming a first trench in the substrate, after the performing of the first etching process, performing a first doping process to form a first sidewall doped region along a sidewall surface of the first trench, performing a second etching process to extend the first trench, thereby forming a second trench in the substrate, and after the performing of the second etching process, performing a second doping process to form a second sidewall doped region along a sidewall surface of the second trench, a portion of the second sidewall doped region overlaps with the first sidewall doped region.

In some embodiments, the method may also include, after the performing of the first doping process and before the performing of the second etching process, performing an annealing process. In some embodiments, the method may also include, before the performing of the first etching process, performing a first blanket doping process to form a first blanket doped region in the substrate, and forming a patterned mask film over the substrate, the patterned mask film comprising an opening exposing the portion of the substrate. In some embodiments, the performing of the first etching process may stop before reaching the first blanket doped region, and the second trench extends into the first blanket doped region. In some embodiments, the method may also include, after the performing of the second doping process, performing a second blanket doping process to form a second blanket doped region in the substrate and over the first blanket doped region. A dopant concentration of the second blanket doped region may be greater than a dopant concentration of the first blanket doped region. A doping polarity of the first and second sidewall doped regions may be opposite to a doping polarity of the first and second blanket doped regions. In some embodiments, the second sidewall doped region may include an upper portion and a lower portion, the upper portion may be overlapped with the first sidewall doped region. A top surface and a bottom surface of the upper portion may be substantially coplanar with a top surface and a bottom surface of the first blanket doped region, respectively, and a top surface and a bottom surface of the lower portion may be substantially coplanar with a top surface and a bottom surface of the second blanket doped region, respectively. In some embodiments, the method may also include performing a third etching process to extend the second trench, thereby forming a third trench in the substrate, and, after the performing of the third etching process, performing a third doping process to form a third sidewall doped region along a sidewall surface of the third trench, a portion of the third sidewall doped region overlaps with the second sidewall doped region.

In some embodiments, an implant dosage of the first doping process may be different than an implant dosage of the second doping process. In some embodiments, an energy of the first doping process may be smaller than an energy of the second doping process. In some embodiments, the method may also include, after the performing of the second doping process, forming a dielectric liner in the second trench, forming a conductive layer over the dielectric liner to fill the second trench, and after forming the conductive layer, performing a plurality of blanket doping processes to form a blanket doped region in the substrate and adjacent to the filled second trench, the blanket doped region having a gradient doping profile. According to the gradient doping profile, a dopant concentration of an upper portion of the blanket doped region may be greater than a dopant concentration of a lower portion of the blanket doped region. In some embodiments, the method may also include, after forming the conductive layer and before the performing of the plurality of blanket doping processes, etching back the dielectric liner and the conductive layer to form a recess in the second trench, and refilling the recess with a dielectric material. In some embodiments, the method may also include, before the performing of the plurality of blanket doping processes, forming a gate dielectric layer over the substrate, after the performing of the plurality of blanket doping processes, forming a gate electrode layer over the gate dielectric layer, and patterning the gate electrode layer and the gate dielectric layer to form a gate structure over the substrate.

In another exemplary aspect, the present disclosure is directed to a method of forming an image sensor device. The method includes receiving a workpiece comprising a first isolation structure formed in a front side of a substrate, a first doped region in a bottom portion the substrate and having a first dopant concentration and a first doping polarity, and a trench extending through the first isolation structure and a portion of the substrate. The method also includes performing a first doping process to form a second doped region along a sidewall surface of the trench, the second doped region having a second doping polarity opposite to the first doping polarity, after the forming of the second doped region, extending the trench downwardly into a portion of the substrate under the first doped region, performing a second doping process to the workpiece to form a third doped region along a sidewall surface of the extended trench, a portion of the third doped region overlapping with the second doped region, and performing a blanket doping process to the workpiece to form a fourth doped region in the substrate, the fourth doped region has a second dopant concentration and the first doping polarity and is disposed laterally adjacent to the second doped region and over the first doped region.

In some embodiments, the second dopant concentration of the fourth doped region may be greater than the first dopant concentration of the first doped region. In some embodiments, the method may also include forming a dielectric liner in the extended trench, forming a conductive layer over the dielectric liner to fill the extended trench, after filling the extended trench, forming a gate trench extending into the portion of the substrate over the first doped region, after the performing of the blanket doping process, forming a gate electrode layer in the gate trench, performing a planarization process to a back side of the substrate to expose the conductive layer, the back side of the substrate being opposite to the front side of the substrate, and forming a color filter under the back side of the substrate and directly under the fourth doped region.

In yet another exemplary aspect, the present disclosure is directed to a semiconductor structure. The semiconductor structure includes a substrate, a photosensitive device comprising a first region in the substrate, the first region comprising a first-type dopant and having a first doping profile where a dopant concentration of an upper portion of the first region is greater than a dopant concentration of a lower portion of the first region, and an isolation structure extending through the substrate and disposed laterally adjacent to the photosensitive device. the isolation structure includes a conductive layer, a dielectric layer extending along a sidewall surface of the conductive layer, and a second region extending along a sidewall surface of the dielectric layer. The second region includes a second-type dopant having a doping polarity opposite to a doping polarity of the first-type dopant, the second region includes a second doping profile where a dopant concentration of an upper portion of the second region is greater than a dopant concentration of a lower portion of the second region.

In some embodiments, according to the first doping profile, a dopant concentration level of the first-type dopant within the first region gradually may decrease as a function of a distance to a front side of the substrate. In some embodiments, a width of the upper portion of the second region may be greater than a width of the lower portion of the second region. In some embodiments, the upper portion of the first region may be disposed laterally adjacent to the upper portion of the second region, and the dopant concentration of the upper portion of the second region may be greater than the dopant concentration of the upper portion of the first region. In some embodiments, the semiconductor device may also include a gate structure disposed over a front side of the substrate and a color filter disposed under a back side of the substrate and directly under the photosensitive device, the back side of the substrate being opposite to the front side of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an image sensor device, comprising:
    performing a first etching process to remove a portion of a substrate, thereby forming a first trench in the substrate;
    before the performing of the first etching process, performing a first blanket doping process to form a first blanket doped region in the substrate;
    after the performing of the first etching process, performing a first doping process to form a first sidewall doped region along a sidewall surface of the first trench;
    performing a second etching process to extend the first trench, thereby forming a second trench in the substrate;
    after the performing of the second etching process, performing a second doping process to form a second sidewall doped region along a sidewall surface of the second trench, a portion of the second sidewall doped region overlaps with the first sidewall doped region; and
    after the performing of the second doping process, performing a second blanket doping process to form a second blanket doped region in the substrate and over the first blanket doped region,
    wherein a dopant concentration of the second blanket doped region is greater than a dopant concentration of the first blanket doped region, and wherein a doping polarity of the first and second sidewall doped regions is opposite to a doping polarity of the first and second blanket doped regions.

2. The method of claim 1, further comprising:
    after the performing of the first doping process and before the performing of the second etching process, performing an annealing process.

3. The method of claim 1, further comprising:
    forming a patterned mask film over the substrate, the patterned mask film comprising an opening exposing the portion of the substrate.

4. The method of claim 3, wherein the performing of the first etching process stops before reaching the first blanket doped region, and the second trench extends into the first blanket doped region.

5. The method of claim 1,
    wherein the second sidewall doped region comprises an upper portion and a lower portion, the upper portion is overlapped with the first sidewall doped region,
    wherein a top surface and a bottom surface of the upper portion are substantially coplanar with a top surface and a bottom surface of the second blanket doped region, respectively, and
    wherein a top surface and a bottom surface of the lower portion are substantially coplanar with a top surface and a bottom surface of the first blanket doped region, respectively.

6. The method of claim 1, further comprising:
    performing a third etching process to extend the second trench, thereby forming a third trench in the substrate; and after the performing of the third etching process, performing a third doping process to form a third sidewall doped region along a sidewall surface of the third trench,
wherein a portion of the third sidewall doped region overlaps with the second sidewall doped region.

7. The method of claim 1, wherein an implant dosage of the first doping process is different than an implant dosage of the second doping process.

8. The method of claim 1, wherein an energy of the first doping process is smaller than an energy of the second doping process.

9. The method of claim 1, further comprising:
after the performing of the second doping process, forming a dielectric liner in the second trench; and
forming a conductive layer over the dielectric liner to fill the second trench.

10. The method of claim 9, further comprising:
after forming the conductive layer and before the performing of the second blanket doping process, etching back the dielectric liner and the conductive layer to form a recess in the second trench; and
refilling the recess with a dielectric material.

11. The method of claim 9, further comprising:
before the performing of the second blanket doping process, forming a gate dielectric layer over the substrate;
after the performing of the second blanket doping process, forming a gate electrode layer over the gate dielectric layer; and
patterning the gate electrode layer and the gate dielectric layer to form a gate structure over the substrate.

12. The method of claim 1, wherein the first and second blanket doped regions comprise an n-type dopant, and the first and second sidewall doped regions comprise a p-type dopant.

13. A method of forming an image sensor device, comprising:
receiving a workpiece comprising:
a first isolation structure formed in a front side of a substrate,
a first doped region in a bottom portion the substrate and having a first dopant concentration and a first doping polarity, and
a trench extending through the first isolation structure and a portion of the substrate;
performing a first doping process to form a second doped region along a sidewall surface of the trench, the second doped region having a second doping polarity opposite to the first doping polarity;
after the forming of the second doped region, extending the trench downwardly into a portion of the substrate under the first doped region;
performing a second doping process to the workpiece to form a third doped region along a sidewall surface of the extended trench, a portion of the third doped region overlapping with the second doped region; and
performing a blanket doping process to the workpiece to form a fourth doped region in the substrate, wherein the fourth doped region has a second dopant concentration and the first doping polarity and is disposed laterally adjacent to the second doped region and over the first doped region.

14. The method of claim 13, wherein the second dopant concentration is greater than the first dopant concentration.

15. The method of claim 13, further comprising:
forming a dielectric liner in the extended trench;
forming a conductive layer over the dielectric liner to fill the extended trench;
after filling the extended trench, forming a gate trench extending into the portion of the substrate over the first doped region;
after the performing of the blanket doping process, forming a gate electrode layer in the gate trench;
performing a planarization process to a back side of the substrate to expose the conductive layer, the back side of the substrate being opposite to the front side of the substrate; and
forming a color filter under the back side of the substrate and directly under the fourth doped region.

16. A method of forming a semiconductor device, comprising:
forming a mask layer covering a first region of a substrate;
forming a trench by recessing a second region of the substrate not covered by the mask layer;
after the forming of the trench, performing a first plasma doping process to form a first p-type doped region in the substrate and adjacent to the trench;
after the performing of the first plasma doping process, further recessing the second region of the substrate to vertically extend the trench;
after the further recessing of the second region of the substrate, performing a second plasma doping process to form a second p-type doped region in the substrate and under the first p-type doped region;
forming an isolation feature in the extended trench, the isolation feature comprising a dielectric liner extending along bottom and sidewall surfaces of a conductive layer; and
after the forming of the isolation feature, removing the mask layer.

17. The method of claim 16, wherein, after the performing of the second plasma doping process, a dopant concentration of the first p-type doped region is higher than a dopant concentration of the second p-type doped region.

18. The method of claim 16, wherein, after the performing of the second plasma doping process, the first p-type doped region laterally spans a first width, the second p-type doped region laterally spans a second width, the second width is less than the first width.

19. The method of claim 16, further comprising:
before the forming of the mask layer, performing a first blanket doping process to form a first n-type doped region in the substrate, wherein the first n-type doped region is disposed under the first p-type doped region; and
after the removing of the mask layer, performing a second blanket doping process to form a second n-type doped region in the substrate, wherein the second n-type doped region is disposed over the first n-type doped region and laterally adjacent to the first p-type doped region.

20. The method of claim 19, wherein a top surface of the isolation feature is lower than a topmost surface of the substrate.

* * * * *